United States Patent
Song et al.

(10) Patent No.: US 12,310,021 B2
(45) Date of Patent: May 20, 2025

(54) VERTICAL MEMORY DEVICE WITH MULTIPLE SUPPORT LAYERS

(71) Applicant: SAMSUNG ELECTRONICS CO., LTD., Suwon-si (KR)

(72) Inventors: Seungmin Song, Seoul (KR); Kangmin Kim, Hwaseong-si (KR); Joongshik Shin, Yongin-si (KR); Geunwon Lim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 193 days.

(21) Appl. No.: 17/806,842

(22) Filed: Jun. 14, 2022

(65) Prior Publication Data
US 2022/0310651 A1   Sep. 29, 2022

Related U.S. Application Data

(63) Continuation of application No. 16/902,489, filed on Jun. 16, 2020, now Pat. No. 11,362,105.

(30) Foreign Application Priority Data

Oct. 30, 2019 (KR) .................. 10-2019-0136325

(51) Int. Cl.
  *H10B 43/27* (2023.01)
  *H10B 43/10* (2023.01)
  *H10B 43/35* (2023.01)

(52) U.S. Cl.
  CPC ............. *H10B 43/27* (2023.02); *H10B 43/10* (2023.02); *H10B 43/35* (2023.02)

(58) Field of Classification Search
  CPC ........ H10B 69/00; H10B 53/00; H10B 53/10; H10B 53/20; H10B 53/30; H10B 53/40;
  (Continued)

(56) References Cited

U.S. PATENT DOCUMENTS 8,476,688 B2   7/2013   Cho et al.
8,847,302 B2   9/2014   Alsmeier et al.
(Continued)

FOREIGN PATENT DOCUMENTS

JP   2015-28982   2/2015
KR   10-0929642   11/2009

OTHER PUBLICATIONS

Written Opinion dated Sep. 9, 2024 in corresponding Singapore Patent Application No. 10202006115 (7 pages).
(Continued)

*Primary Examiner* — Didarul A Mazumder
*Assistant Examiner* — Gustavo G Ramallo
(74) *Attorney, Agent, or Firm* — MORGAN, LEWIS & BOCKIUS LLP

(57) ABSTRACT

A vertical memory device includes gate electrode structures, channels, first to third division patterns, and a first support layer. The gate electrode structure includes gate electrodes stacked in a first direction, and extends in a second direction. The gate electrode structures are spaced apart from one another in a third direction. The first division pattern extends in the second direction between the gate electrode structures. The second and third division patterns are alternately disposed in the second direction between the gate electrode structures. The first support layer is on the gate electrode structures at substantially the same height as upper portions of the first and second division patterns, and contacts the upper portions of the first and second division patterns. The upper portions of the first and second division patterns are arranged in a zigzag pattern in the second direction in a plan view.

20 Claims, 31 Drawing Sheets

(58) Field of Classification Search
CPC ........ H10B 53/50; H10B 41/00; H10B 41/10;
H10B 41/20; H10B 41/23; H10B 41/27;
H10B 41/30; H10B 41/35; H10B
41/40–44; H10B 41/46–50; H10B 41/60;
H10B 41/70; H10B 43/00; H10B 43/10;
H10B 43/20; H10B 43/23; H10B 43/27;
H10B 43/30; H10B 43/35; H10B 43/40;
H10B 43/50; H10B 51/00; H10B 51/10;
H10B 51/20; H10B 51/30; H10B 51/40;
H10B 51/50

See application file for complete search history.

(56) References Cited

U.S. PATENT DOCUMENTS

| | | | |
|---|---|---|---|
| 9,196,627 | B2 | 11/2015 | Konno et al. |
| 9,281,316 | B2 | 3/2016 | Lee |
| 9,306,041 | B2 | 4/2016 | Hwang et al. |
| 10,566,346 | B2 | 2/2020 | Lee et al. |
| 11,049,871 | B2 | 6/2021 | Ohnuki |
| 11,069,698 | B2 | 7/2021 | Kim et al. |
| 11,362,105 | B2 * | 6/2022 | Song ............... H10B 43/27 |
| 11,532,639 | B2 * | 12/2022 | Lee .................. H10B 41/10 |
| 2014/0054676 | A1 * | 2/2014 | Nam ................. H10B 41/10 257/324 |
| 2014/0239375 | A1 | 8/2014 | Kim et al. |
| 2014/0264549 | A1 | 9/2014 | Lee |
| 2015/0028982 | A1 | 1/2015 | Barry et al. |
| 2015/0318301 | A1 | 11/2015 | Lee et al. |
| 2015/0372101 | A1 | 12/2015 | Lee et al. |
| 2016/0064407 | A1 | 3/2016 | Kim et al. |
| 2017/0179027 | A1 * | 6/2017 | Kim ................. H10B 43/40 |
| 2017/0309635 | A1 * | 10/2017 | Kim ................. H10B 43/27 |
| 2018/0130814 | A1 * | 5/2018 | Lee ................. H10B 43/27 |
| 2018/0374862 | A1 * | 12/2018 | Lee ................. H10B 43/50 |
| 2019/0043883 | A1 | 2/2019 | Xu et al. |
| 2019/0157294 | A1 | 5/2019 | Kanamori et al. |
| 2019/0181226 | A1 | 6/2019 | Choi et al. |
| 2021/0134831 | A1 | 5/2021 | Song et al. |
| 2021/0320125 | A1 | 10/2021 | Shin et al. |

OTHER PUBLICATIONS

Search Report dated Sep. 9, 2024 in corresponding Singapore Patent Application No. 10202006115 (2 pages).

Office Action dated Jul. 16, 2024 in corresponding Japanese Patent Application No. 2020-172417, 4 pages (in Japanese).

Office Action dated Mar. 7, 2022 in corresponding German Patent Application No. 10 2020 115 239.6 (17 pages).

Notice of Allowance dated Jan. 21, 2024 in corresponding Japanese Patent Application No. 2020-172417, 3 pages, in Japanese.

* cited by examiner

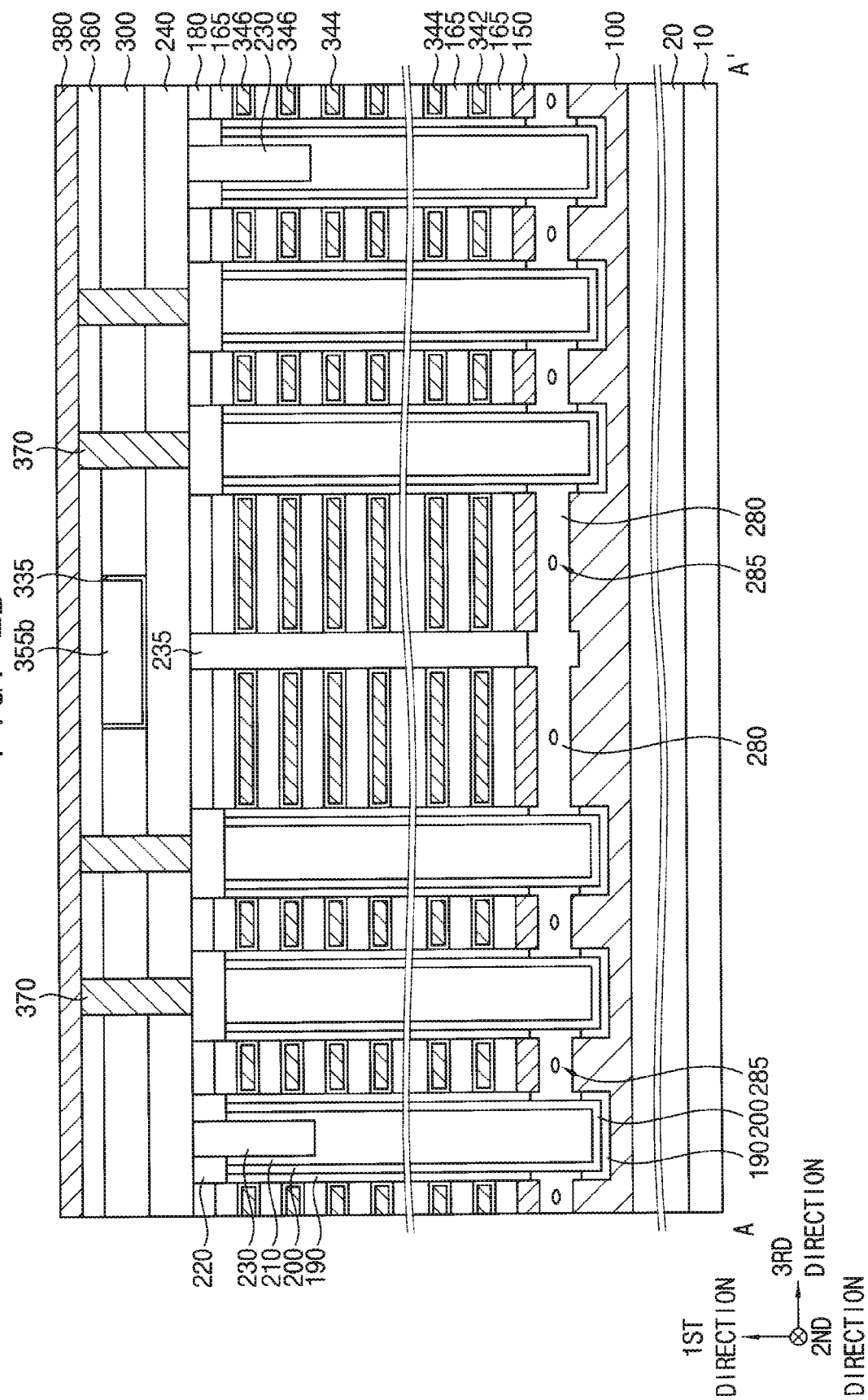

FIG. 6
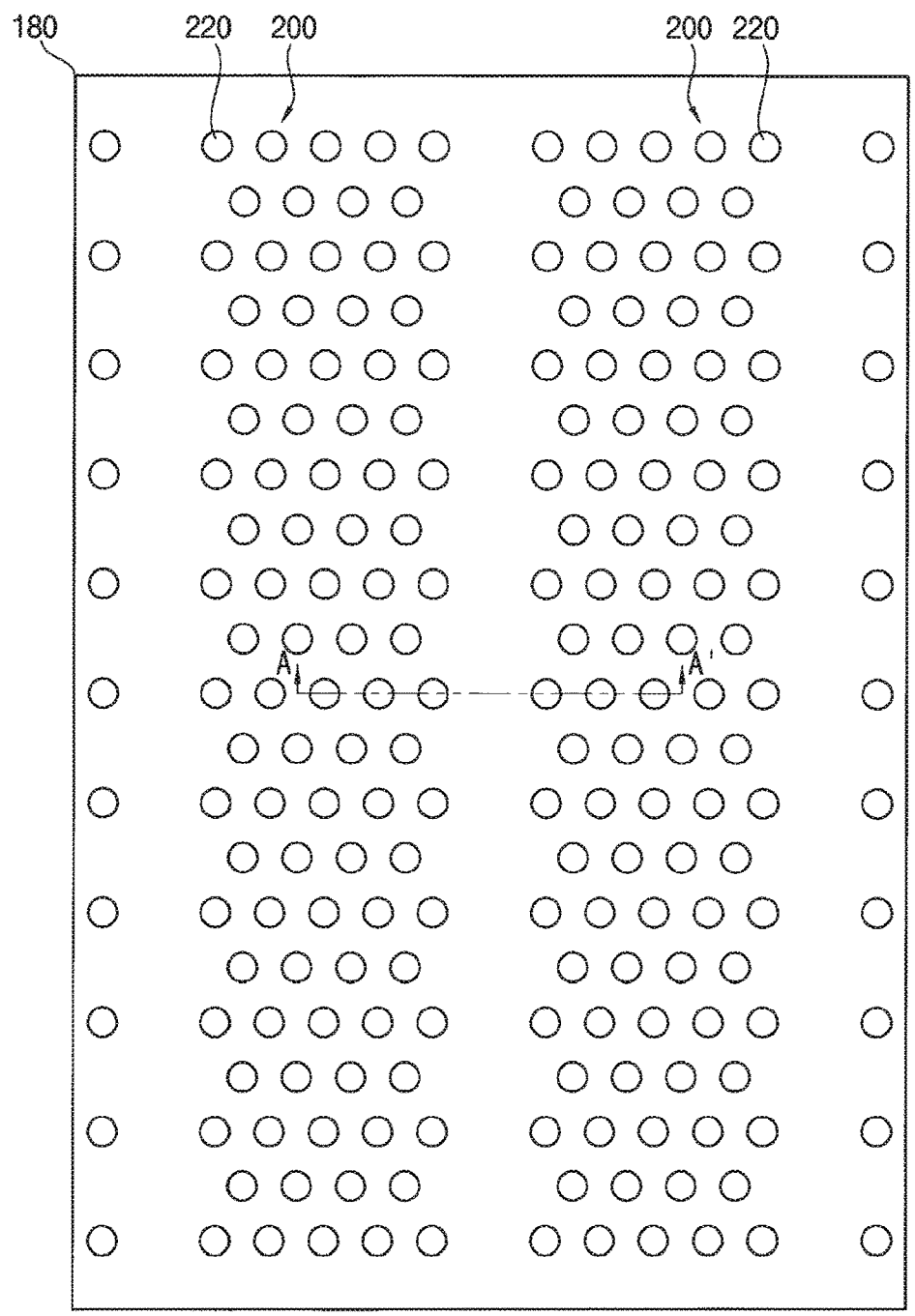
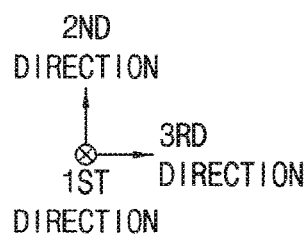

VERTICAL MEMORY DEVICE WITH MULTIPLE SUPPORT LAYERS

CROSS-REFERENCE TO RELATED APPLICATION

This U.S. patent application is a continuation application of U.S. patent application Ser. No. 16/902,489 filed Jun. 16, 2020, claims priority under 35 U.S.C. § 119 to Korean Patent Application No. 10-2019-0136325, filed on Oct. 30, 2019 in the Korean Intellectual Property Office (KIPO), the disclosure of which is incorporated by reference herein in its entirety.

TECHNICAL FIELD

Exemplary embodiments of the inventive concept relate to a vertical memory device.

DISCUSSION OF RELATED ART

In a VNAND flash memory device, as the number of stacked gate electrodes increases, a mold including sacrificial layers for forming the gate electrodes may be bent or fall down.

SUMMARY

According to an exemplary embodiment of the inventive concept, a vertical memory device may include gate electrode structures, channels, a first division pattern, second and third division patterns, and a first support layer. Each of the gate electrode structures may include gate electrodes spaced apart from one another on a substrate in a first direction substantially perpendicular to an upper surface of the substrate, and extending in a second direction substantially parallel to the upper surface of the substrate. The gate electrode structures may be spaced apart from one another in a third direction substantially parallel to the upper surface of the substrate and crossing the second direction. Each of the channels may extend through one of the gate electrode structures in the first direction. The first division pattern may extend in the second direction between first ones of the gate electrode structures neighboring in the third direction. The second and third division patterns may be alternately disposed in the second direction between second ones of the gate electrode structures neighboring in the third direction. The first support layer may be formed on the gate electrode structures at substantially the same height as upper portions of the first and second division patterns. The first support layer may contact the upper portions of the first and second division patterns. The upper portions of the first division patterns and the upper portions of the second division patterns may be arranged in a zigzag pattern in the second direction in a plan view.

According to an exemplary embodiment of the inventive concept, a vertical memory device may include gate electrode structures, channels, a first division pattern, a second division pattern, third division patterns, and a support layer. Each of the gate electrode structures may include gate electrodes spaced apart from one another on a substrate in a first direction substantially perpendicular to an upper surface of the substrate, and extending in a second direction substantially parallel to the upper surface of the substrate. The gate electrode structures may be spaced apart from one another in a third direction substantially parallel to the upper surface of the substrate and crossing the second direction. The channels may each extend through one of the gate electrode structures in the first direction. The first division pattern may include a first lower portion and first upper portions. The first lower portion may extend in the second direction between first ones of the gate electrode structures neighboring in the third direction to separate the first ones of the gate electrode structures from one another. The first upper portions may be spaced apart from one another in the second direction, and contact an upper surface of the first lower portion. The second division pattern may include second lower portions and second upper portions. The second lower portions may be spaced apart from one another in the second direction and disposed between second ones of the gate electrode structures. The second upper portions may contact upper surfaces of the second lower portions. The third division patterns may be disposed between the second lower portions of the second division pattern. The support layer may be formed on the gate electrode structures, and may face sidewalls of the first and second upper portions of the first and second division patterns, respectively.

According to an exemplary embodiment of the inventive concept, a vertical memory device may include gate electrode structures, channels, first division patterns, second division patterns, a support layer, and first and second insulation patterns. Each of the gate electrode structures may include gate electrodes spaced apart from one another on a substrate in a first direction substantially perpendicular to an upper surface of the substrate, and extending in a second direction substantially parallel to the upper surface of the substrate. The gate electrode structures may be spaced apart from one another in a third direction substantially parallel to the upper surface of the substrate and crossing the second direction. The channels may each extend through one of the gate electrode structures in the first direction. Each of the first division patterns may extend in the second direction between first ones of the gate electrode structures neighboring in the third direction to separate the first ones of the gate electrode structures from one another. The second division patterns may be spaced apart from one another in the second direction between second ones of the gate electrode structures neighboring in the third direction. The support layer may be formed on the gate electrode structures and the first and second division patterns, and may include first and second openings at least partially exposing upper surfaces of the first and second division patterns, respectively. The first and second insulation patterns may fill the first and second openings, respectively. The first and second insulation patterns may be arranged in a zigzag pattern in the third direction.

According to an exemplary embodiment of the inventive concept, a vertical memory device may include a common source plate (CSP), a channel connection pattern, a first support layer, gate electrode structures, channels, a first division pattern, second and third division patterns, and a second support layer. The CSP may be formed on a substrate. The channel connection pattern and the first support layer may be sequentially stacked on the CSP in a first direction substantially perpendicular to an upper surface of the substrate. The gate electrode structures may each include gate electrodes spaced apart from one another on the first support layer in the first direction, and extending in a second direction substantially parallel to the upper surface of the substrate. The gate electrode structures may be spaced apart from one another in a third direction substantially parallel to the upper surface of the substrate and crossing the second direction. The channels may each extend in the first direction through one of the gate electrode structures, the first support layer, and the channel connection pattern on the CSP, and the channels may be electrically connected to one another. The first division pattern may extend in the second direction between first ones of the gate electrode structures neighboring in the third direction to separate the first ones of the gate electrode structures from one another. The second and third division patterns may be alternately disposed in the second direction between second ones of the gate electrode structures neighboring in the third direction to separate the second ones of the gate electrode structures from one another. The second support layer may be formed on the gate electrode structures at substantially the same height as upper portions of the first and second division patterns. The upper portions of the first division pattern and the upper portions of the second division patterns may be arranged in a zigzag pattern in the second direction.

A method of manufacturing a vertical memory device may include forming a common source plate (CSP) on a substrate in a first direction, forming a plurality of insulation layers and a plurality of sacrificial layers that are alternately stacked in the first direction to form a mold on the CSP, etching the mold to form a first opening exposing the CSP and dividing the plurality of sacrificial layers into sacrificial patterns, where the second opening separates the sacrificial patterns in a third direction crossing the first direction, forming first division patterns in the first opening, forming second and third openings extending in a second direction crossing the first and third directions, where the second openings are disposed between the second division patterns in the second direction, forming a first support layer on the mold and the first division pattern, where the first support layer includes fourth and fifth openings, removing the sacrificial patterns to form a gap between the plurality of insulation layers, forming gate electrodes in the gap, where the gate electrodes are alternately stacked with the plurality of insulation layers, filling the second to fifth openings to form a division layer, and planarizing the division layer until the first support layer is exposed to form second and third division patterns, where the second division pattern is disposed in the second and fourth openings and the third division pattern is disposed in the third and fifth openings. The first and third division patterns are alternately disposed in the second direction.

BRIEF DESCRIPTION OF THE DRAWINGS

FIGS. 1, 2A, 2B, and 3 are a plan view and cross-sectional views illustrating a vertical memory device in accordance with exemplary embodiments of the inventive concept.

FIGS. 4 to 25 are plan views and cross-sectional views illustrating a method of manufacturing a vertical memory device in accordance with exemplary embodiments of the inventive concept.

DETAILED DESCRIPTION OF THE EMBODIMENTS

Figure 1:
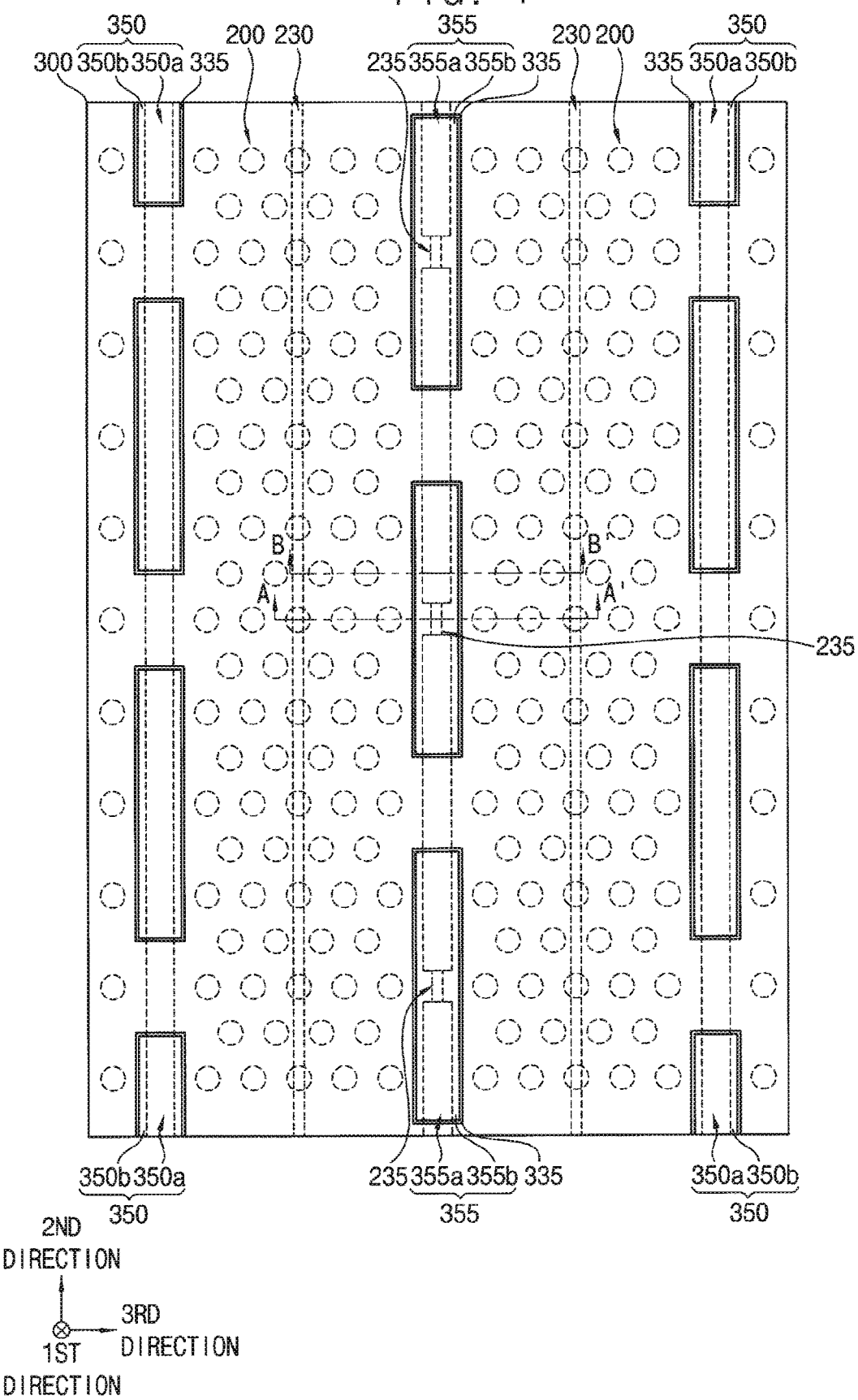

Exemplary embodiments of the inventive concept provide a vertical memory device having improved characteristics.

Exemplary embodiments of the inventive concept will be described more fully hereinafter with reference to the accompanying drawings. Like reference numerals may refer to like elements throughout this application.

It will be understood that, although the terms "first," "second," "third", etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second or third element, component, region, layer, or section without departing from the teachings of inventive concept.

Hereinafter in the specification (not necessarily in the claims), a direction substantially perpendicular to an upper surface of a substrate may be referred to as a first direction, and two directions substantially parallel to the upper surface of the substrate and crossing each other may be referred to as second and third directions, respectively. In exemplary embodiments of the inventive concept, the second and third directions may be substantially perpendicular to each other.

Figure 2A:
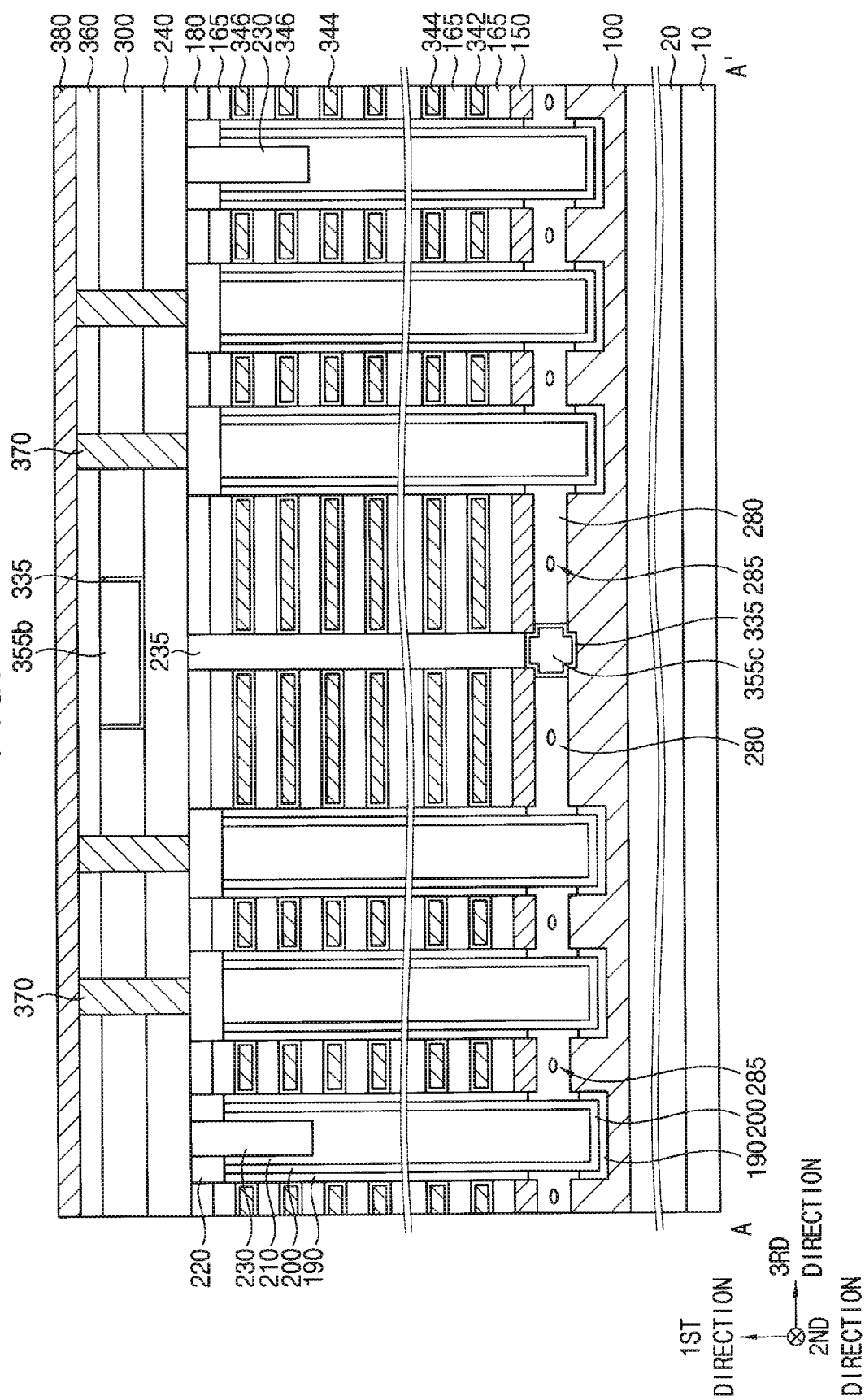
Figure 3:
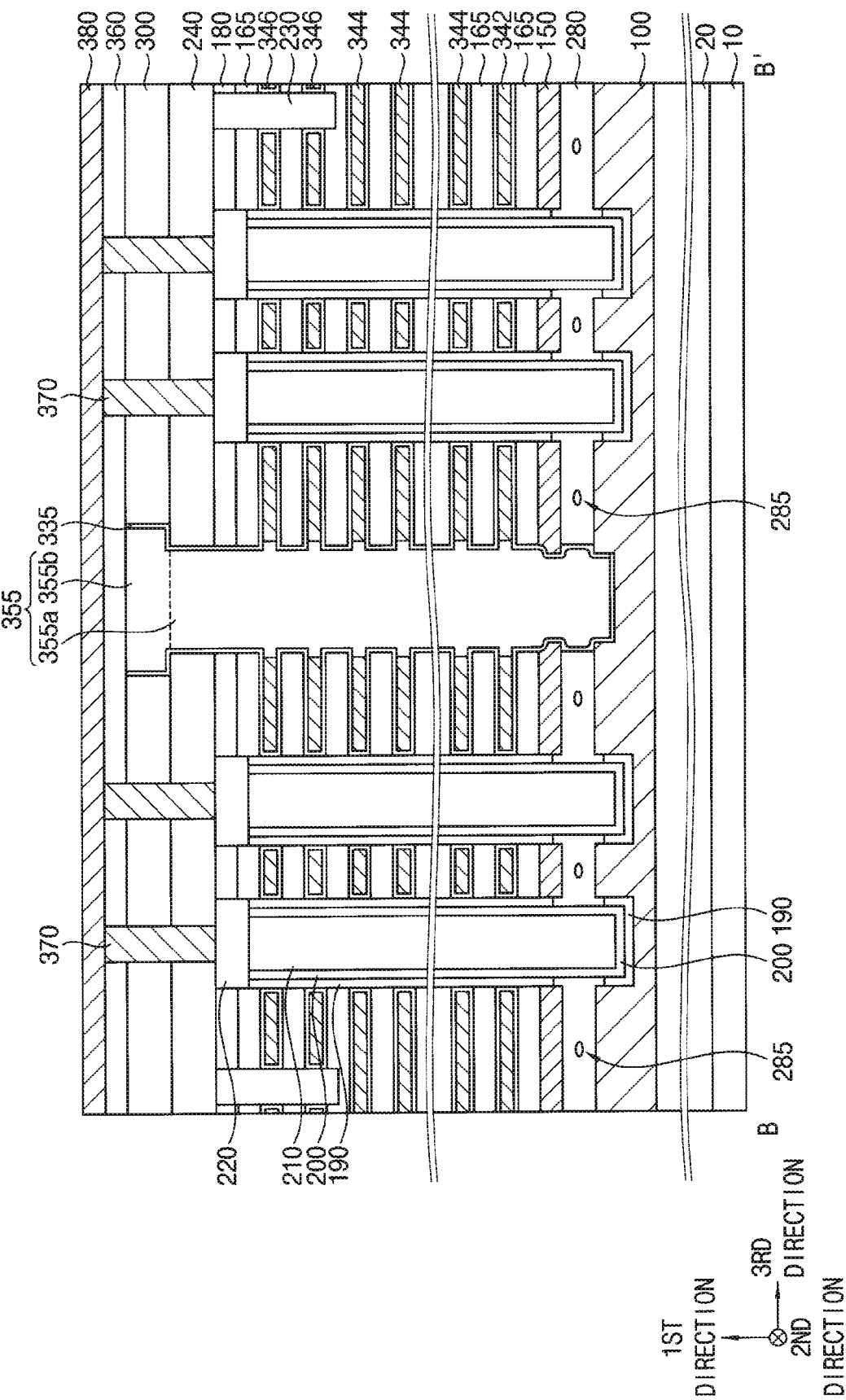

FIGS. 1, 2A, 2B, and 3 are a plan view and cross-sectional views illustrating a vertical memory device in accordance with exemplary embodiments of the inventive concept. FIG. 1 is the plan view, FIGS. 2A and 2B are cross-sectional views taken along a line A-A' of FIG. 1, and FIG. 3 is a cross-sectional view taken along a line B-B' of FIG. 1. In order to avoid complexity of the drawings, FIG. 1 does not show fourth and fifth insulating interlayers, contact plugs, and wirings.

Referring to FIGS. 1, 2A, and 3, the vertical memory device may include a common source plate (CSP) 100, a channel connection pattern 280, a first support layer 150, a second support layer 300, a gate electrode structure, a channel 200, a charge storage structure 190, and first to fourth division patterns 230, 235, 350, and 355 on a substrate 10. The vertical memory device may further include lower circuit patterns, a filling pattern 210, a capping pattern 220, an insulation pattern 165, first to fourth insulating interlayers 20, 180, 240, and 360, a fifth insulating interlayer, a contact plug 370, and an upper wiring 380.

The substrate 10 may include silicon, germanium, silicon-germanium, or a III-V compound such as GaP, GaAs, GaSb, etc. In exemplary embodiments of the inventive concept, the substrate 10 may be a silicon-on-insulator (SOI) substrate or a germanium-on-insulator (GOI) substrate.

In exemplary embodiments of the inventive concept, the vertical memory device may have a cell over periphery (COP) structure. In other words, the lower circuit patterns may be formed on the substrate 10, and memory cells may be formed over the lower circuit patterns. The lower circuit patterns may include, e.g., transistors, lower contact plugs, lower wirings, lower vias, etc. The lower circuit patterns may be covered by the first insulating interlayer 20 on the substrate 10.

The CSP 100 may be formed on the first insulating interlayer 20, and may include, e.g., polysilicon doped with n-type impurities.

The gate electrode structure may include gate electrodes 342, 344, and 346 spaced apart from each other in the first direction on the CSP 100. Each of the gate electrodes 342, 344, and 346 may extend in the second direction. Lengths of the gate electrodes 342, 344, and 346 extending in the second direction may decrease from lower levels to upper levels, and thus the gate electrode structure may have a staircase shape.

The gate electrodes 342, 344, and 346 may include first, second and third gate electrodes 342, 344, and 346 sequentially stacked in the first direction. The first gate electrode 342 may serve as a ground selection line (GSL), each of the second gate electrodes 344 may serve as a word line, and the third gate electrode 346 may serve as a string selection line (SSL).

Each of the first to third gate electrodes 342, 344, and 346 may be formed at one or a plurality of levels. In exemplary embodiments of the inventive concept, the first gate electrode 342 may be formed at a lowermost level, the third gate electrode 346 may be formed at an uppermost level and one level directly under the uppermost level, and the second gate electrode 344 may be formed at a plurality of levels between the first and third gate electrodes 342 and 346. The uppermost level is furthest from the substrate 10 and the lowermost level is closest to the substrate 10. Or in other words, the uppermost level (or an upper level) is closer to the first support layer 150 than to the substrate 10.

Each of the first to third gate electrodes 342, 344, and 346 may include a conductive pattern and a barrier pattern covering lower and upper surfaces and a sidewall of the conductive pattern. The conductive pattern may include a low resistance metal, e.g., tungsten, titanium, tantalum, platinum, etc., and the barrier pattern may include a metal nitride, e.g., titanium nitride, tantalum nitride, etc.

Lower and upper surfaces and a sidewall facing the channel 200 of each of the gate electrodes 342, 344, and 346 may be covered by a second blocking pattern 335. The second blocking pattern 335 may include a metal oxide, e.g., aluminum oxide, hafnium oxide, etc., and thus may be referred to as a metal oxide pattern. The second blocking pattern 335 may also cover sidewalls of the insulation patterns 165, the first and second support layers 150 and 300, the channel connection pattern 280, the second and third insulating interlayers 180 and 240, and an upper surface of the CSP 100.

The insulation pattern 165 may be formed between the gate electrodes 342, 344, and 346 that neighbor each other in the first direction, and the gate electrodes 342, 344, and 346 and the insulation patterns 165 may form a mold having a staircase shape. The insulation pattern 165 may include an oxide, e.g., silicon oxide.

In exemplary embodiments of the inventive concept, the gate electrode structure may extend in the second direction, and a plurality of gate electrode structures may be formed in the third direction. The second to fourth division patterns 235, 350, and 355 may be formed between the gate electrode structures, which may be separated from one another in the third direction.

The third division pattern 350 may include a first lower portion 350a extending in the second direction between the gate electrode structures, and first upper portions 350b, each of which may contact an upper surface of the first lower portion 350a, spaced apart from each other in the second direction. The gate electrode structures may be separated from each other in the third direction by the first lower portion 350a of the third division pattern 350.

In an exemplary embodiment of the inventive concept, a width in the third direction of each of the first upper portions 350b may be greater than a width in the third direction of the first lower portion 350a; however, the inventive concept may not be limited thereto. The second blocking pattern 335 may cover a portion of a sidewall of the first lower portion 350a of the third division pattern 350 and a sidewall of the first upper portion 350b of the third division pattern 350. A plurality of third division patterns 350 may be spaced apart from one another in the third direction.

The fourth division pattern 355 may include second lower portions 355a spaced apart from one another in the second direction between the gate electrode structures, and second upper portions 355b each commonly contacting upper surfaces of the second lower portions 355a neighboring each other in the second direction (e.g., neighboring second lower portions). In exemplary embodiments of the inventive concept, the fourth division pattern 355 may be formed between the third division patterns 350 neighboring each other in the third direction (e.g., neighboring third division patterns).

In an exemplary embodiment of the inventive concept, a width in the third direction of each of the second upper portions 355b may be greater than a width in the third direction of each of the second lower portions 355a; however, the inventive concept may not be limited thereto. The second blocking pattern 335 may cover a portion of a sidewall of the second lower portion 355a of the fourth division pattern 355, and a sidewall of the second upper portion 355b of the fourth division pattern 355. In other words, the second upper portions 355b and the lower portions 355a of the fourth division pattern 355 may be similar to the first upper portions 350b and the first lower portion 350a of the third division pattern 350; however, the inventive concept is not limited thereto.

In exemplary embodiments of the inventive concept, the first upper portions 350b of the third division pattern 350 and the second upper portions 355b of the fourth division pattern 355 may be arranged in a zigzag pattern along the second direction or the third direction in a plan view. In exemplary embodiments of the inventive concept, each of the first upper portions 350b of the third division pattern 350 may partially overlap in the third direction at least one of the second upper portions 355b of the fourth division patterns 355. In exemplary embodiments of the inventive concept, the first upper portions 350b of the third division pattern 350 and the second upper portions 355b of the fourth division pattern 355 may be disposed at substantially the same height.

The third and fourth division patterns 350 and 355 may include substantially the same material, e.g., an oxide such as silicon oxide. Thus, the third and fourth division patterns 350 and 355 may be referred to as first and second insulation patterns, respectively. Alternatively, the first and second upper portions 350b and 355b or the first and second lower portions 350a and 355a of the third and fourth division patterns 350 and 355 may be referred to as the first and second insulation patterns, respectively. If the first and second upper portions 350b and 355b of the third and fourth division patterns 350 and 355 are referred to as the first and second insulation patterns, respectively, the first and second insulation patterns may be arranged in a zigzag pattern along the second direction or the third direction, and each of the first insulation patterns may partially overlap at least one of the second insulation patterns in the third direction.

The second division pattern 235 may be formed between the second lower portions 355a of the fourth division patterns 355 neighboring each other in the second direction, and may be connected thereto. Thus, the gate electrode structures may be separated from one another in the third direction by the second division patterns 235 and the second lower portions 355a of the fourth division pattern 355. In exemplary embodiments of the inventive concept, each of the second division patterns 235 may overlap the second upper portion 355b of the fourth division pattern 355 in the first direction.

In exemplary embodiments of the inventive concept, an upper surface of the second division pattern 235 may be substantially coplanar with an upper surface of the second insulating interlayer 180 on an uppermost one of the insulation patterns 165 and the capping pattern 220, and thus may be lower than upper surfaces of the first and second lower portions 350a and 355a of the third and fourth division patterns 350 and 355, which may be substantially coplanar with an upper surface of the third insulating interlayer 240 on the second insulating interlayer 180. In other words, a distance of the upper surfaces of the first and second lower portions 350a and 355a of the third and fourth division patterns 350 and 355 from the substrate 10 is greater than a distance of the upper surface of the second division pattern 235 from the substrate 10.

The second division pattern 235 may include an oxide, e.g., silicon oxide. Therefore, the second to fourth division patterns 235, 350, and 355 may include substantially the same material.

The channel 200 may be formed in a channel hole extending through the mold, which may include the first to third gate electrodes 342, 344, and 346 sequentially stacked in the first direction and the insulation patterns 165 interposed therebetween, and the second insulating interlayer 180 to expose an upper surface of the CSP 100. Thus, the channel 200 may extend in the first direction.

For example, the channel 200 may extend in the first direction on the CSP 100, and may have a cup-like shape. The channel 200 may include undoped or doped polysilicon or single crystalline silicon.

In exemplary embodiments of the inventive concept, the channel 200 may be formed in each of the second and third directions. A plurality of channels 200 arranged in the second direction may form a channel column, a plurality of channel columns arranged in the third direction may form a channel group, and a plurality of channel groups arranged in the third direction may form a channel block. In the figures, one channel block includes two channel groups, and each of the channel groups includes nine channel columns; however, the inventive concept may not be limited thereto.

The charge storage structure 190 may include an upper portion extending in the first direction to cover most of an outer sidewall of the channel 200 and having a hollow cylindrical shape, and a lower portion covering a bottom surface and a lower sidewall of the channel 200 on the CSP 100 and having a cup-like shape. The lower portion of the charge storage structure 190 may be spaced apart from the upper portion of charge storage structure 190. Each of the lower and upper portions of the charge storage structure 190 may include a tunnel insulation pattern, a charge storage pattern, and a first blocking pattern sequentially stacked from the outer sidewall and/or the bottom surface of the channel 200.

The tunnel insulation pattern and the first blocking pattern may include an oxide, e.g., silicon oxide, and the charge storage pattern may include a nitride, e.g., silicon nitride.

The filling pattern 210 may fill an inner space formed by an inner sidewall of the channel 200. The filling pattern 210 may include an oxide, e.g., silicon oxide.

The channel 200, the charge storage structure 190, and the filling pattern 210 may be formed in the channel hole on the CSP 100, and the capping pattern 220 may be formed in an upper portion of the channel hole, e.g., on the channel 200, the charge storage structure 190 and the filling pattern 210. The capping pattern 220 may include, e.g., polysilicon doped with n-type impurities.

The first division pattern 230 may extend through upper portions of the channels 200 included in the channel column at a central portion in the third direction of each channel group, and may extend in the second direction. In other words, the first division pattern 230 may extend in the second direction between the third and fourth division patterns 350 and 355. In exemplary embodiments of the inventive concept, the first division pattern 230 may extend through not only the upper portions of the channels 200 but also upper portions of the charge storage structure 190 and the filling pattern 210, the capping pattern 220, the second insulating interlayer 180, the insulation patterns 165 at upper two levels, and the third gate electrodes 346. Thus, the third gate electrodes 346 at the upper two levels, in the gate electrode structure may be separated from each other in the third direction by the first division pattern 230.

The channel connection pattern 280 and the first support layer 150 may be sequentially stacked in the first direction on the CSP 100. The channel connection pattern 280 may contact a lower outer sidewall of each of the channels 200, e.g., an outer sidewall of each of the channels 200, which may be formed between the lower and upper portions of the charge storage structure 190 not covered by the charge storage structure 190, and thus, the channels 200 included in each of the channel group may be connected with each other. The channel connection pattern 280 may include, e.g., polysilicon doped with n-type impurities, and may have an air gap 285 therein.

The first support layer 150 may be formed between the channel connection pattern 280 and the first gate electrode 342. However, a portion of the first support layer 150 may extend through the channel connection pattern 280 to contact an upper surface of the CSP 100, which may be referred to as a support pattern. A plurality of support patterns may be formed, and may have various types of layouts. The first support layer 150 may include, e.g., polysilicon doped with n-type impurities.

The second insulating interlayer 180 may cover the mold, and may be formed on the CSP 100 and the uppermost one of the insulation patterns 165. The third insulating interlayer 240 may be formed on the second insulating interlayer 180, the capping pattern 220, and the first and second division patterns 230 and 235.

Figure 18:
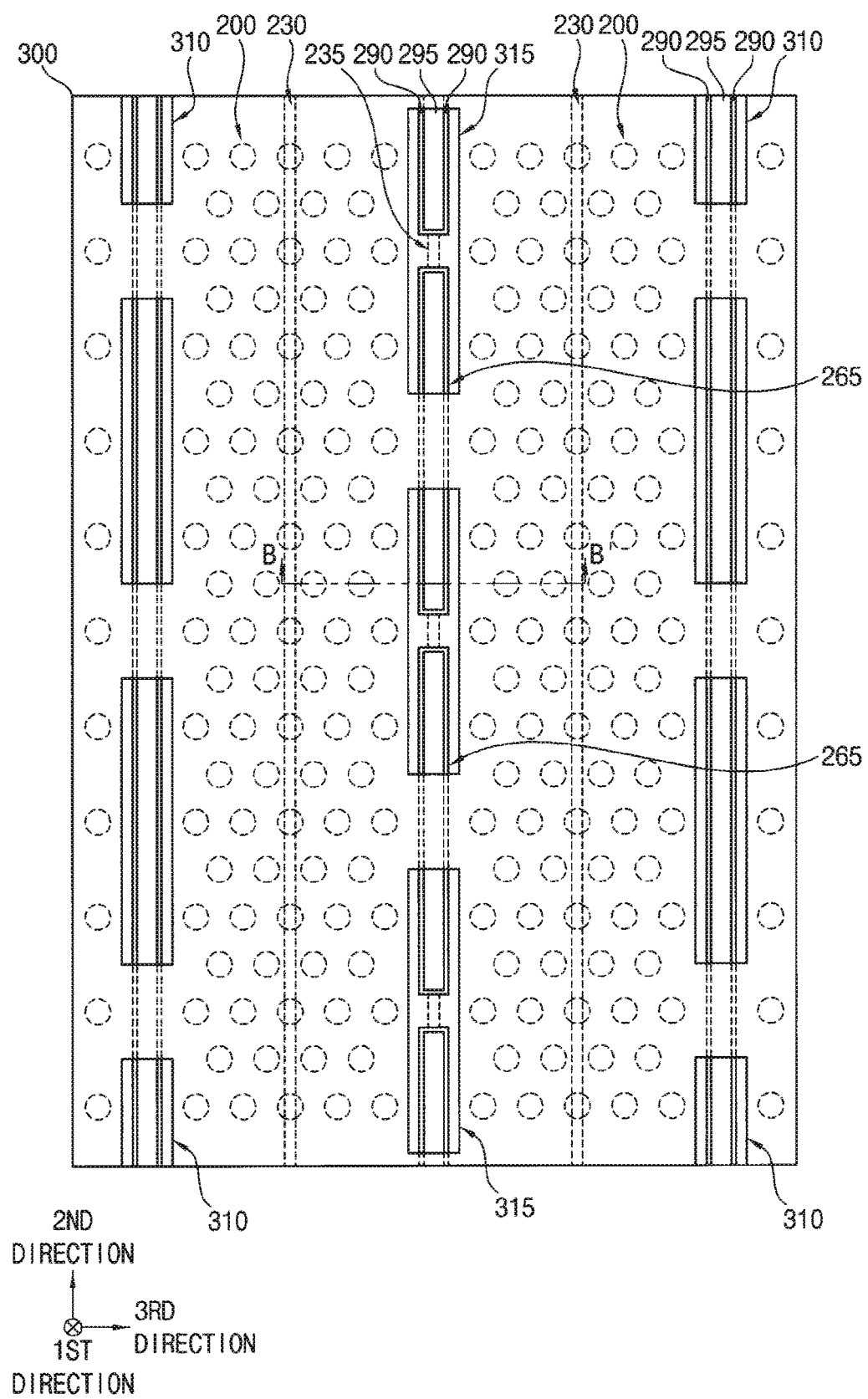

The second support layer 300 may be formed on the third insulating interlayer 240, and may include fifth and sixth openings 310 and 315 (refer to FIG. 18). Thus, the second support layer 300 may be formed at substantially the same height as the first and second upper portions 350b and 355b of the third and fourth division patterns 350 and 355 in the fifth and sixth openings 310 and 315, respectively, and may face a portion of the second blocking pattern 335 on sidewalls of the fifth and sixth openings 310 and 315. The second support layer 300 may include an oxide, e.g., silicon oxide.

The fourth insulating interlayer 360 may be formed on the second support layer 300, and the first upper portions 350b and 355b of the third and fourth division patterns 350 and 355, and the fifth insulating interlayer may be formed on the fourth insulating interlayer 360.

The contact plug 370 may extend through the third and fourth insulating interlayers 240 and 360 and the second support layer 300 to contact an upper surface of the capping pattern 220, and the upper wiring 380 may extend in the third direction to contact the contact plugs 370. In exemplary embodiments of the inventive concept, a plurality of upper wirings 380 may be formed in the second direction. The upper wiring 380 may serve as a bit line of the vertical memory device.

The fourth division pattern 355 may include a protrusion portion 355c. At least a portion of the protrusion portion 355c may be formed at substantially the same height as the channel connection pattern 280 to protrude under the second division pattern 235 in the second direction. A surface of the protrusion portion 355c of the fourth division pattern 355 may be covered by the second blocking pattern 335.

Alternatively, referring to FIG. 2B, instead of the protrusion portion 355c of the fourth division pattern 355, the channel connection pattern 280 may be formed under the second division pattern 235. In this case, the channels 200 included in each of channel groups neighboring in the second direction may be electrically connected to one another by the channel connection pattern 280.

As illustrated above, the vertical memory device may include the second to fourth division patterns 235, 350, and 355 between the gate electrode structures, and the second support layer 300 on the gate electrode structures. Therefore, the mold including the gate electrode structures may not be bent or fall down even though the mold has a high upper surface or a long extension length, which will be illustrated and described below.

FIGS. 4 to 25 are plan views and cross-sectional views illustrating a method of manufacturing a vertical memory device in accordance with exemplary embodiments of the inventive concept. FIGS. 4, 6, 8, 10, 16, 18, and 20 are the plan views, and FIGS. 5, 7, 9, 11-15, 17, 19, and 21-25 are the cross-sectional views.

FIGS. 5, 7, 9, 12, 14, 22 and 24 are cross-sectional views taken along lines A-A' of corresponding plan views, and FIGS. 11, 13, 15, 17, 19, 21, 23 and 25 are cross-sectional views taken along lines B-B' of corresponding plan views.

Figure 4:
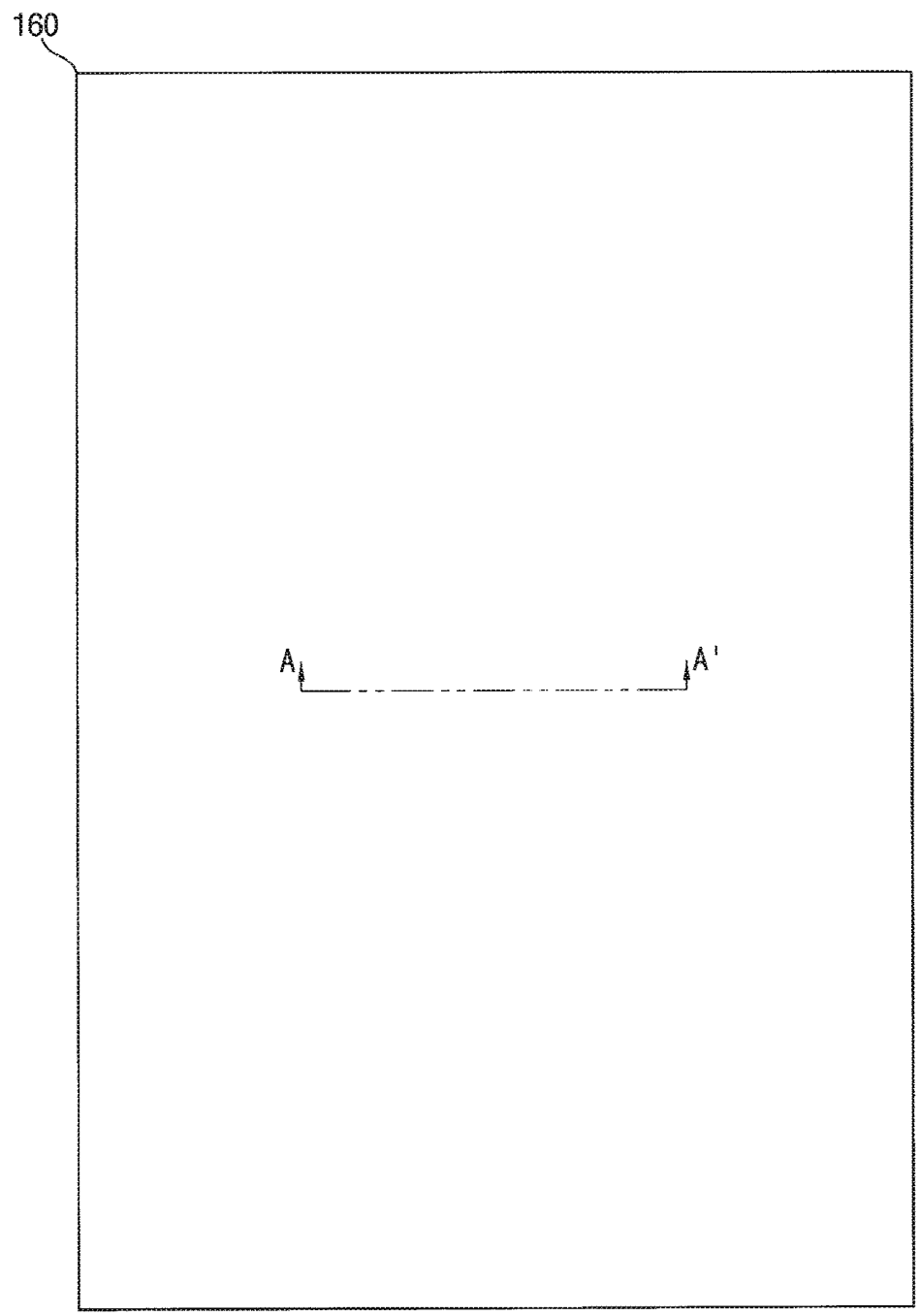
Figure 5:
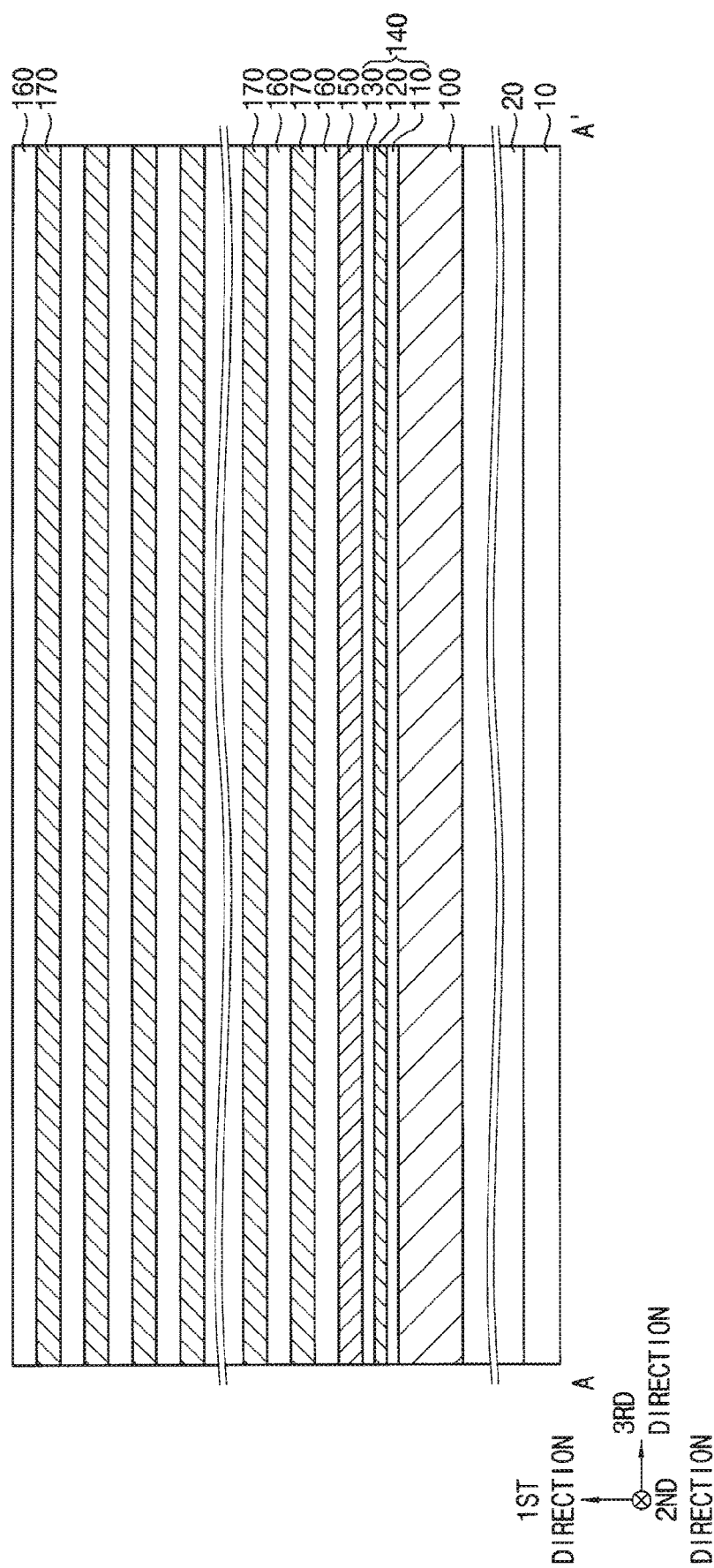

Referring to FIGS. 4 and 5, lower circuit patterns may be formed on the substrate 10, and the first insulating interlayer 20 may be formed on the substrate 10 to cover the first insulating interlayer 20.

The CSP 100, a sacrificial layer structure 140, and the first support layer 150 may be sequentially formed on the first insulating interlayer 20.

The sacrificial layer structure 140 may include first to third sacrificial layers 110, 120 and 130 sequentially stacked. Each of the first and third sacrificial layers 110 and 130 may include an oxide, e.g., silicon oxide, and the second sacrificial layer 120 may include a nitride, e.g., silicon nitride.

The first support layer 150 may include a material having an etching selectivity with respect to the first to third sacrificial layers 110, 120 and 130, e.g., polysilicon doped with n-type impurities. In exemplary embodiments of the inventive concept, the first support layer 150 may be formed by depositing amorphous silicon doped with n-type impurities, and by performing a heat treatment or by being crystallized through heat generated during the deposition process for other structures to include polysilicon doped with n-type impurities.

An insulation layer 160 and a fourth sacrificial layer 170 may be alternately and repeatedly formed on the first support layer 150, and thus a mold layer including the insulation layers 160 and the fourth sacrificial layers 170 may be formed. The insulation layer 160 may include an oxide, e.g., silicon oxide, and the fourth sacrificial layer 170 may include a material having an etching selectivity with respect to the insulation layer 160, e.g., a nitride such as silicon nitride.

Figure 7:
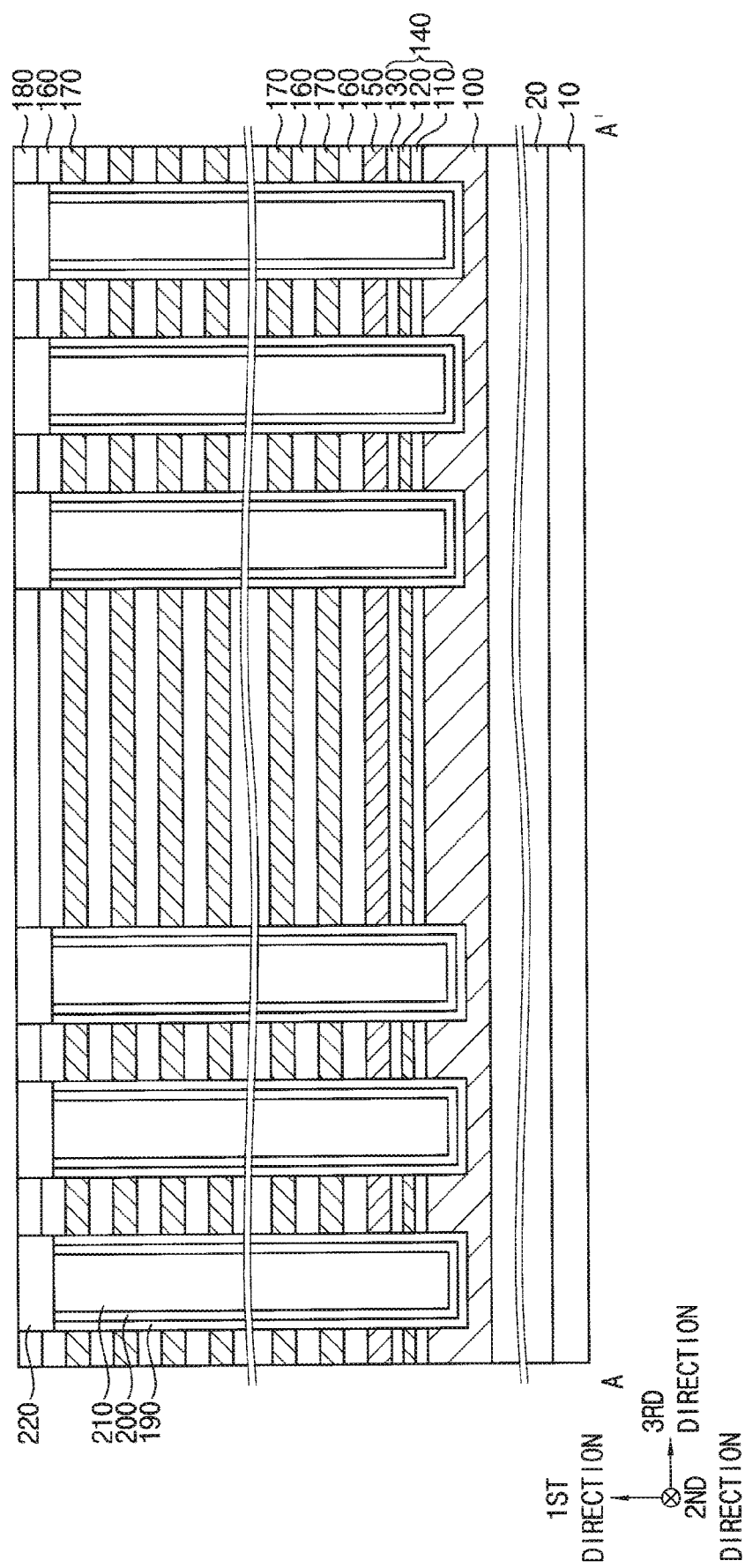

Referring to FIGS. 6 and 7, an etching process using a photoresist pattern as an etching mask and a trimming process for reducing an area of the photoresist pattern may be alternately and repeatedly performed to form a mold having a plurality of step layers each including the fourth sacrificial layer 170 and the insulation layer 160 sequentially stacked and having a staircase shape.

The second insulating interlayer 180 may be formed on the CSP 100 to cover the mold, and a channel hole may be formed through the second insulating interlayer 180, the mold, the first support layer 150, and the sacrificial layer structure 140 to expose an upper surface of the CSP 100. A plurality of channel holes may be formed in each of the second and third directions.

A charge storage structure layer and a channel layer may be formed on a sidewall of each of the channel holes, the exposed upper surface of the CSP 100, and an upper surface of the second insulating interlayer 180, and a filling layer may be formed on the channel layer to fill the channel holes. The filling layer, the channel layer and the charge storage structure layer may be planarized until the upper surface of the second insulating interlayer 180 may be exposed to form the charge storage structure 190, the channel 200, and the filling pattern 210 in each of the channel holes.

In exemplary embodiments of the inventive concept, a plurality of channels 200 may be formed in each of the second and third directions. The plurality of channels 200 arranged in the second direction may form a channel column, a plurality of channel columns arranged in the third direction may form a channel group, and a plurality of channel groups arranged in the second third may form a channel block.

In exemplary embodiments of the inventive concept, the charge storage structure 190 may include a tunnel insulation pattern, a charge storage pattern, and a first blocking pattern sequentially stacked in a horizontal direction substantially parallel to the upper surface of the substrate 10 from an outer sidewall of the channel 200.

An upper portion of a pillar structure including the charge storage structure 190, the channel 200, and the filling pattern 210 stacked in each of the channel holes may be removed to form a trench, and the capping pattern 220 may be formed to fill the trench.

Figure 8:
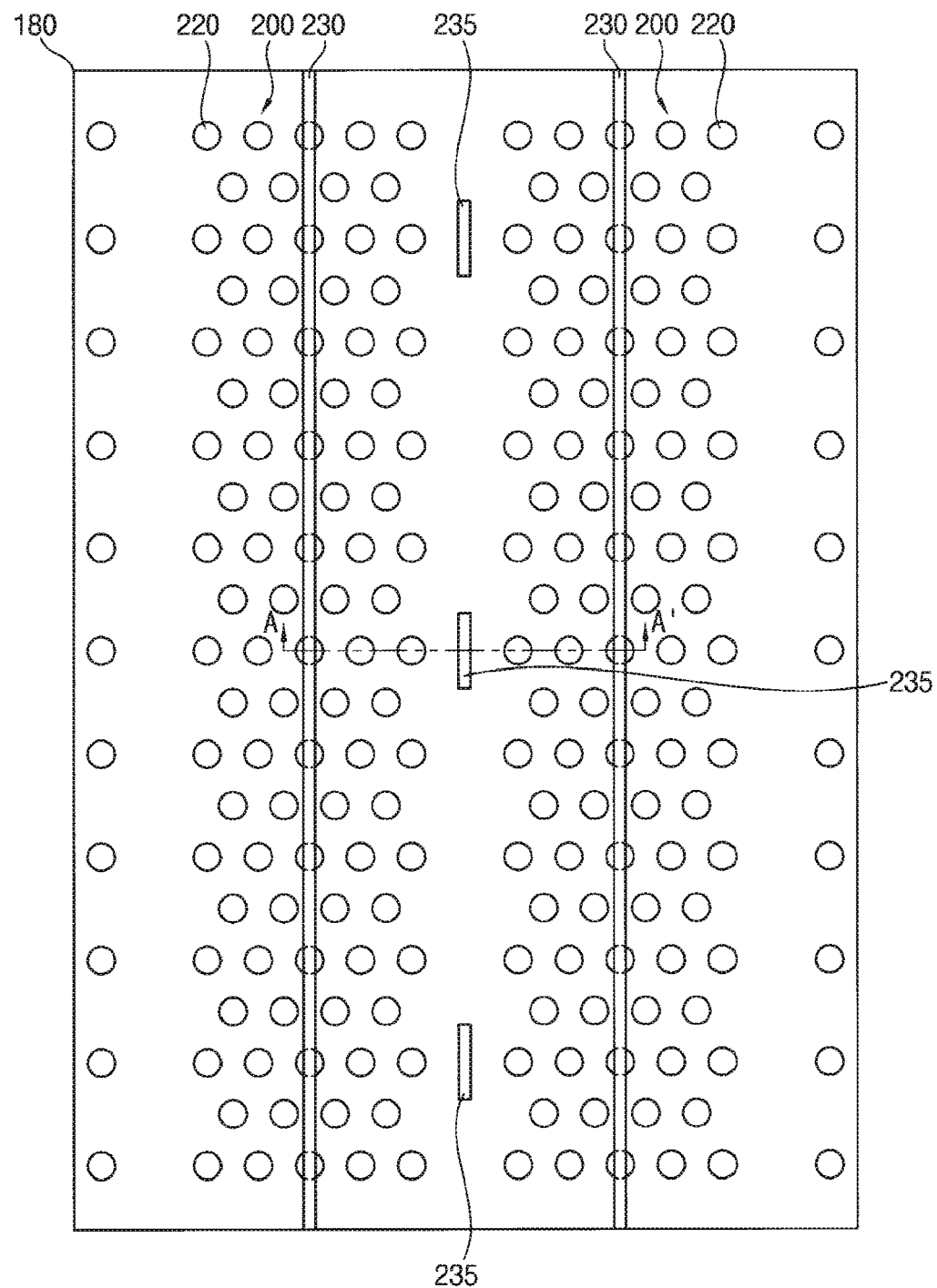
Figure 9:
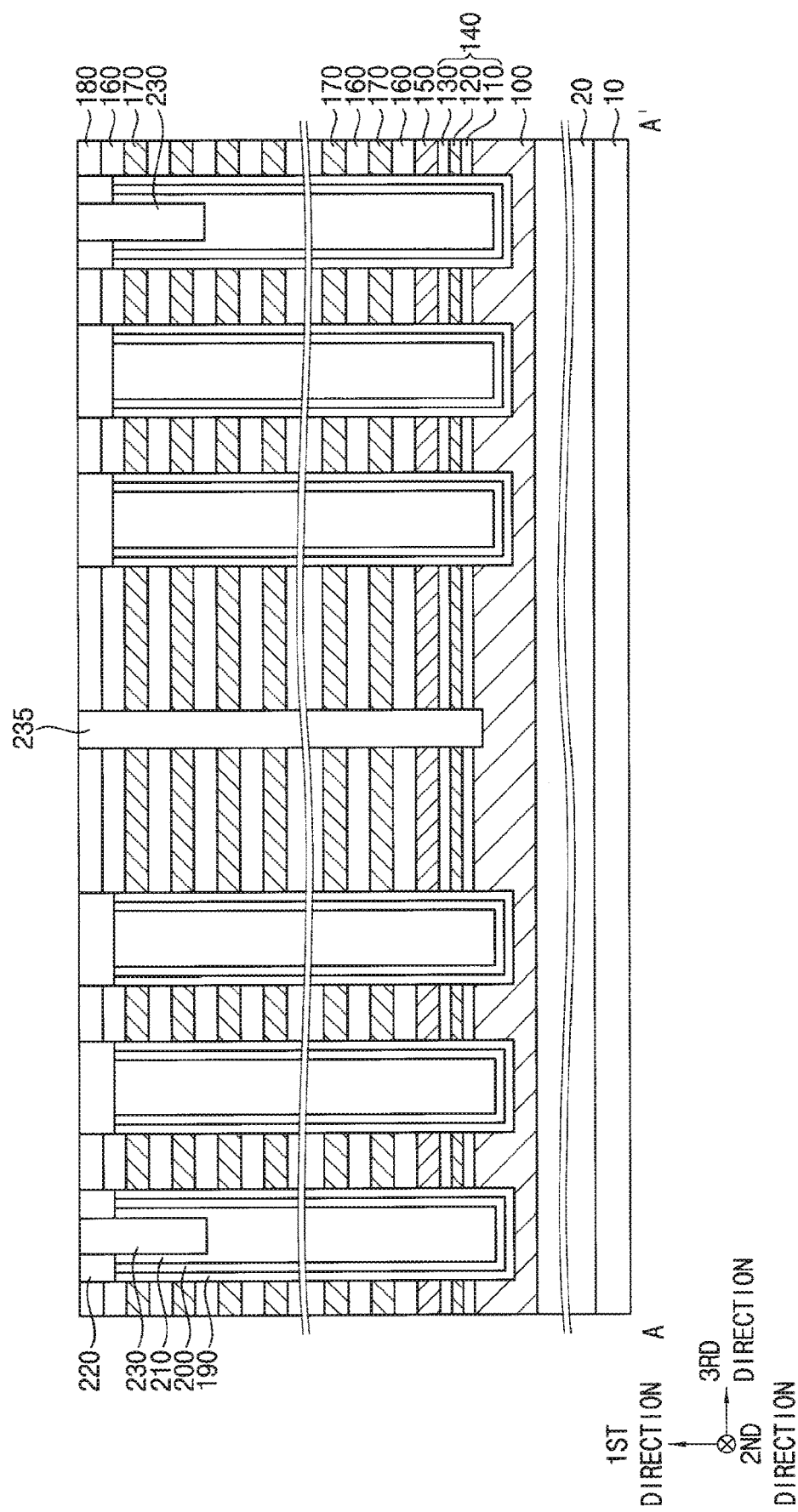

Referring to FIGS. 8 and 9, the second insulating interlayer 180, some of the insulation layers 160, and some of the fourth sacrificial layers 170 may be etched to form a first opening extending in the second direction, and the first division pattern 230 may be formed to fill the first opening.

In an exemplary embodiment of the inventive concept, the first division pattern 230 may extend through upper portions of the channels 200 included in the channel column at a central portion in the third direction of each channel group. In exemplary embodiments of the inventive concept, the first division pattern 230 may extend through not only the upper portions of the channels 200 but also the fourth sacrificial layers 170 at the upper two levels, respectively, and the insulation layers 160 at the upper two levels, and a portion of one of the insulation layers 160 directly thereunder. The first division pattern 230 may extend in the second direction, and may extend through upper two step layers included in the mold. Thus, the fourth sacrificial layers 170 at the upper two levels may be separated from each other in the third direction by the first division pattern 230.

Additionally, the second insulating interlayer 180, the mold, the first support layer 150, and the sacrificial layer structure 140 may be etched to form a second opening exposing an upper surface of the CSP 100, and the second division pattern 235 may be formed in the second opening. In exemplary embodiments of the inventive concept, a plurality of second division patterns 235 may be spaced apart from one another in the second direction between the first division patterns 230 neighboring in the third direction, more particularly, between the channel groups neighboring in the third direction in each channel block.

The first and second division patterns 230 and 235 may be formed by the same etching process and deposition process, or by independent etching processes and deposition processes.

Figure 10:
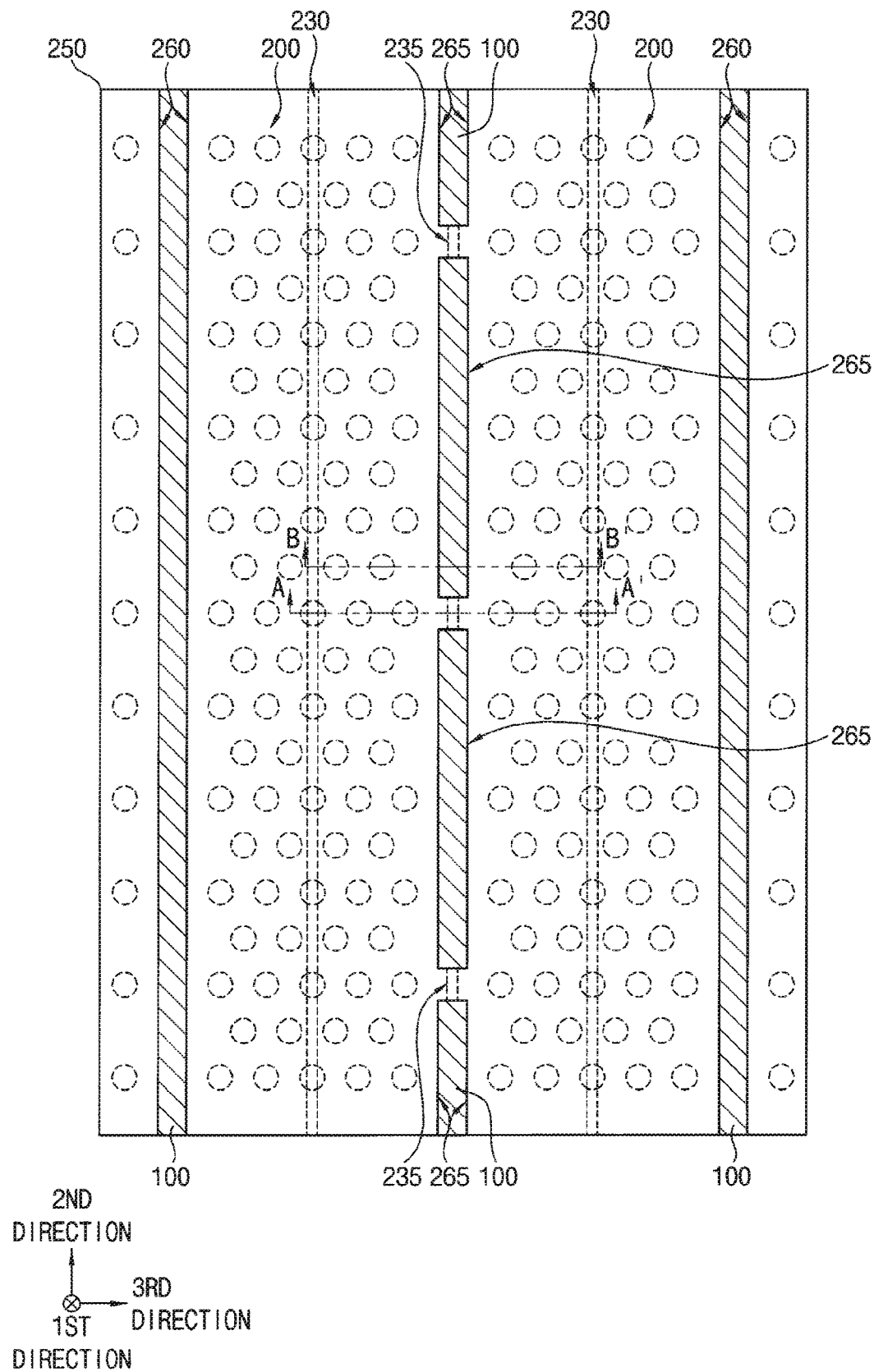
Figure 11:
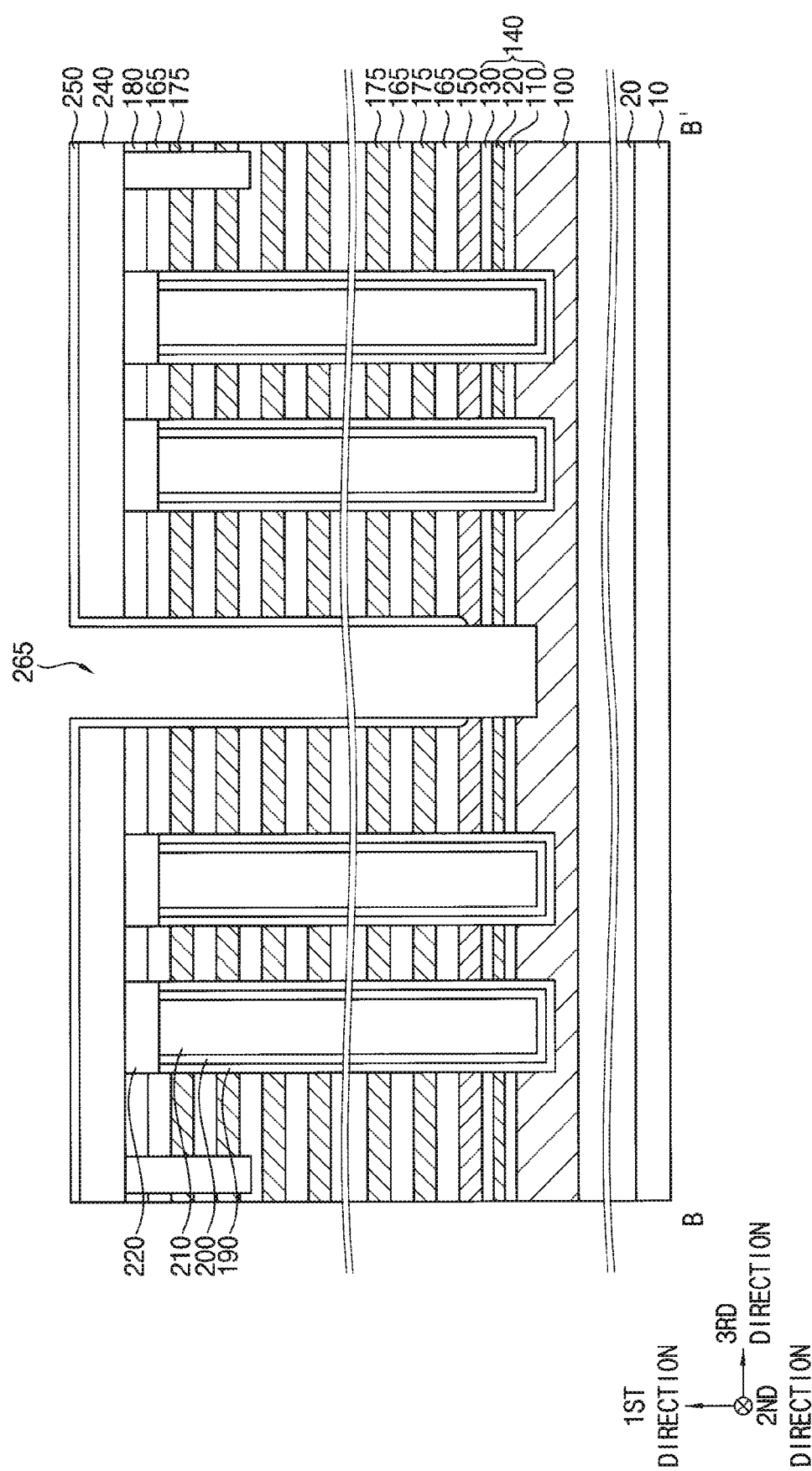

Referring to FIGS. 10 and 11, the third insulating interlayer 240 may be formed on the second insulating interlayer 180, the capping pattern 220, and the first and second division patterns 230 and 235, and third and fourth openings 260 and 265 may be formed through the second and third insulating interlayers 180 and 240 and the mold by, e.g., a dry etching process.

The dry etching process may be formed until each of the third and fourth openings 260 and 265 may expose an upper surface of the first support layer 150, and each of the third and fourth openings 260 and 265 may extend through an upper portion of the first support layer 150. The insulation layers 160 and the fourth sacrificial layers 170 included in the mold may be exposed by the third and fourth openings 260 and 265.

In exemplary embodiments of the inventive concept, the third opening 260 may extend in the second direction between the channel blocks neighboring in the third direction, and a plurality of third openings 260 may be formed in the third direction. In exemplary embodiments of the inventive concept, the fourth opening 265 may be formed between the second division patterns 235 arranged in the second direction, and may be connected to end portions in the second direction of each of the second division patterns 235. In other words, a plurality of fourth openings 265 may be spaced apart from one another in the second direction, and each of the fourth openings 265 may be formed between channel groups neighboring in the third direction in each of channel blocks.

As the second division pattern 235 and the third and fourth openings 260 and 265 are formed, the insulation layer 160 may be divided into a plurality of first insulation patterns 165 each extending in the second direction, and the fourth sacrificial layer 170 may be divided into a plurality of fourth sacrificial patterns 175 each extending in the second direction.

A plurality of fourth openings 265 may be spaced apart from one another in the second direction between the third openings 260 neighboring in the third direction, each of which may extend in the second direction, and the second division pattern 235 may be formed between the fourth openings 265 neighboring in the second direction. Thus, even though a height of an upper surface of the mold is high and a length of the mold extending in the second direction is long, the fourth opening 265 does not extend to end portions in the second direction of the mold A plurality of fourth openings 265 are spaced apart from one another in the second direction and the second division pattern 235 is formed therebetween, and thus the mold may not be bent or fall down in the third direction.

A first spacer layer may be formed on sidewalls of the third and fourth openings 260 and 265 and the third insulating interlayer 240, and may be anisotropically etched to remove portions of the first spacer layer on bottoms of the third and fourth openings 260 and 265, so that a first spacer 250 may be formed and that an upper surface of the first support layer 150 may be exposed.

The exposed portion of the first support layer 150 and a portion of the sacrificial layer structure 140 thereunder may be removed to enlarge the third and fourth openings 260 and 265 downwardly. Thus, the third and fourth openings 260 and 265 may expose an upper surface of CSP 100, and further extend through an upper portion of the CSP 100.

In exemplary embodiments of the inventive concept, the first spacer 250 may include undoped amorphous silicon or undoped polysilicon. However, if the first spacer 250 includes undoped amorphous silicon, the first spacer 250 may be crystallized by heat generated during deposition processes for other layers so as to include undoped polysilicon.

Figure 12:
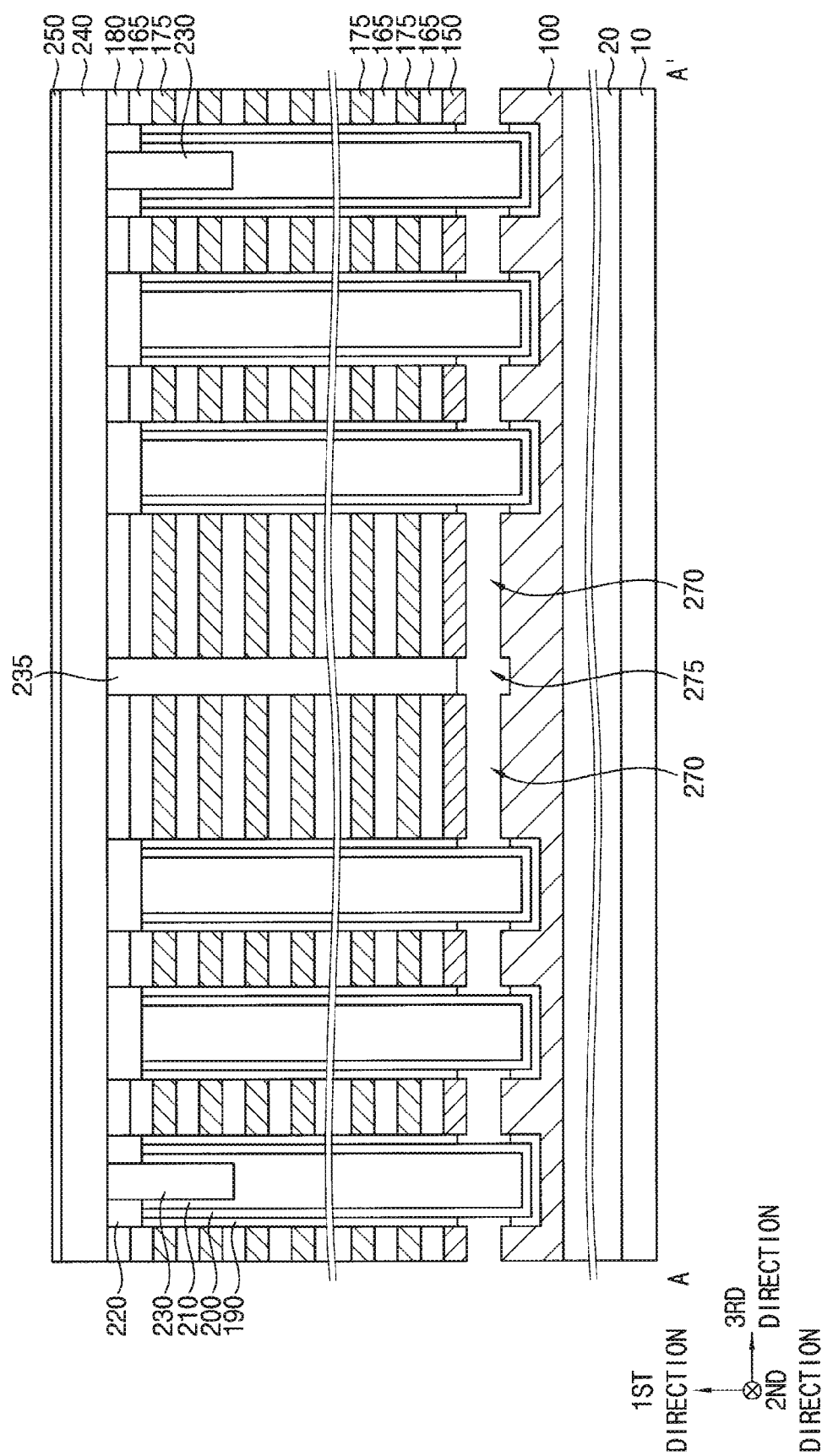
Figure 13:
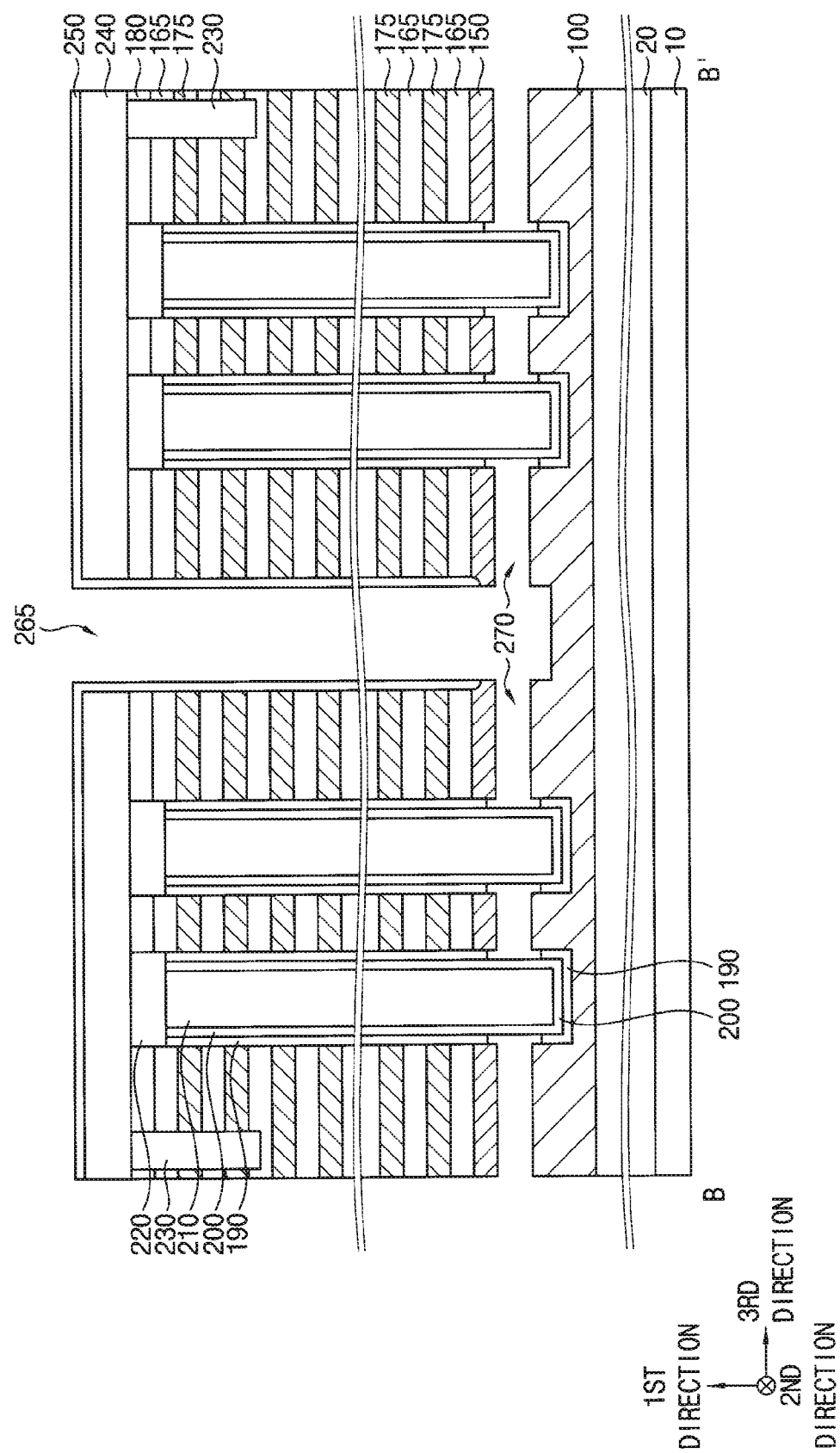

Referring to FIGS. 12 and 13, the sacrificial layer structure 140 exposed by the third and fourth openings 260 and 265 may be removed by, e.g., a wet etching process to form a first gap 270.

The wet etching process may be performed using, e.g., hydrofluoric acid or phosphoric acid.

When the sacrificial layer structure 140 is partially removed, sidewalls of the third and fourth openings 260 and 265 may be covered by the first spacer 250, and thus the insulation patterns 165 and the fourth sacrificial patterns 175 of the mold may not be removed.

As the first gap 270 is formed, a lower surface of the first support layer 150 and an upper surface of the CSP 100 may be exposed. Additionally, a portion of a sidewall of the charge storage structure 190 may be exposed by the first gap 270, and the exposed portion of the sidewall of the charge storage structure 190 may be also removed during the wet etching process to expose an outer sidewall of the channel 200. Accordingly, the charge storage structure 190 may be divided into an upper portion extending through the mold and covering most of the outer sidewall of the channel 200, and a lower portion covering a bottom surface of the channel 200 on the CSP 100.

When the first gap 270 is formed, a portion of the second division pattern 235 at substantially the same height as the sacrificial layer structure 140 may be also removed to form a second gap 275.

Figure 14:
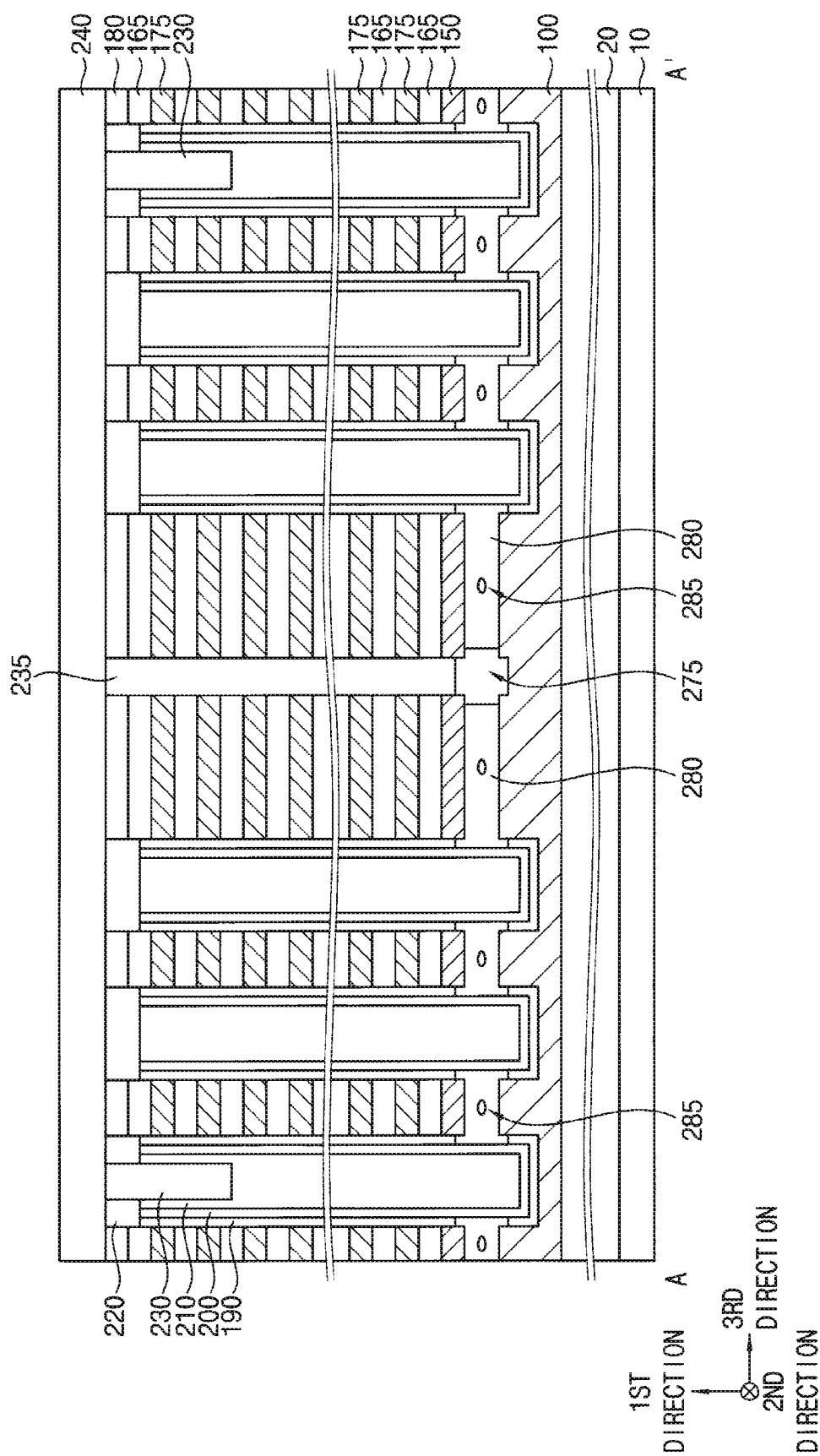
Figure 15:
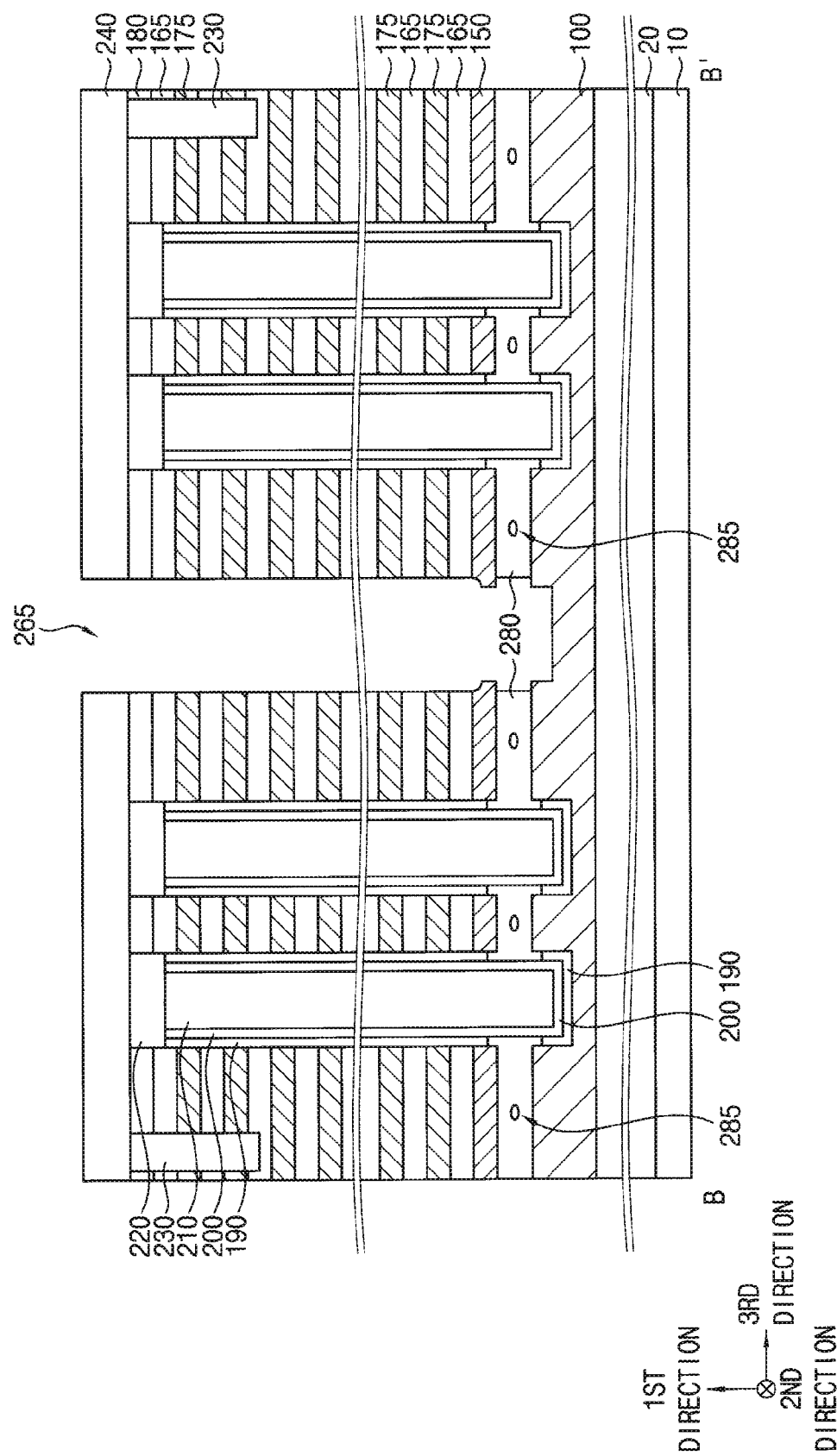

Referring to FIGS. 14 and 15, the first spacer 250 may be removed, a channel connection layer may be formed on the sidewalls of the third and fourth openings 260 and 265 and in the first and second gaps 270 and 275, and for example, an etch back process or a wet etching process may be performed to remove portions of the channel connection layer in the third and fourth openings 260 and 265, so that the channel connection pattern 280 may be formed in the first gap 270.

During the etch back process or the wet etching process, a portion of the channel connection layer in the second gap 275 may be also removed; however, the inventive concept may not be limited thereto. Thus, in some cases, the portion of the channel connection layer in the second gap 275 may remain as the channel connection pattern 280 therein.

As the channel connection pattern 280 is formed, the channels 200 in each channel group may be connected with one another, and if the channel connection pattern 280 remains in the second gap 275, the channels 200 in each channel block may be connected with one another via the channel connection pattern 280.

The channel connection pattern 280 may include, e.g., amorphous silicon doped with n-type impurities, and may be crystallized by heat generated during deposition processes for other layers, so as to include polysilicon doped with n-type impurities.

The air gap 285 may be formed in the channel connection pattern 280.

Figure 16:
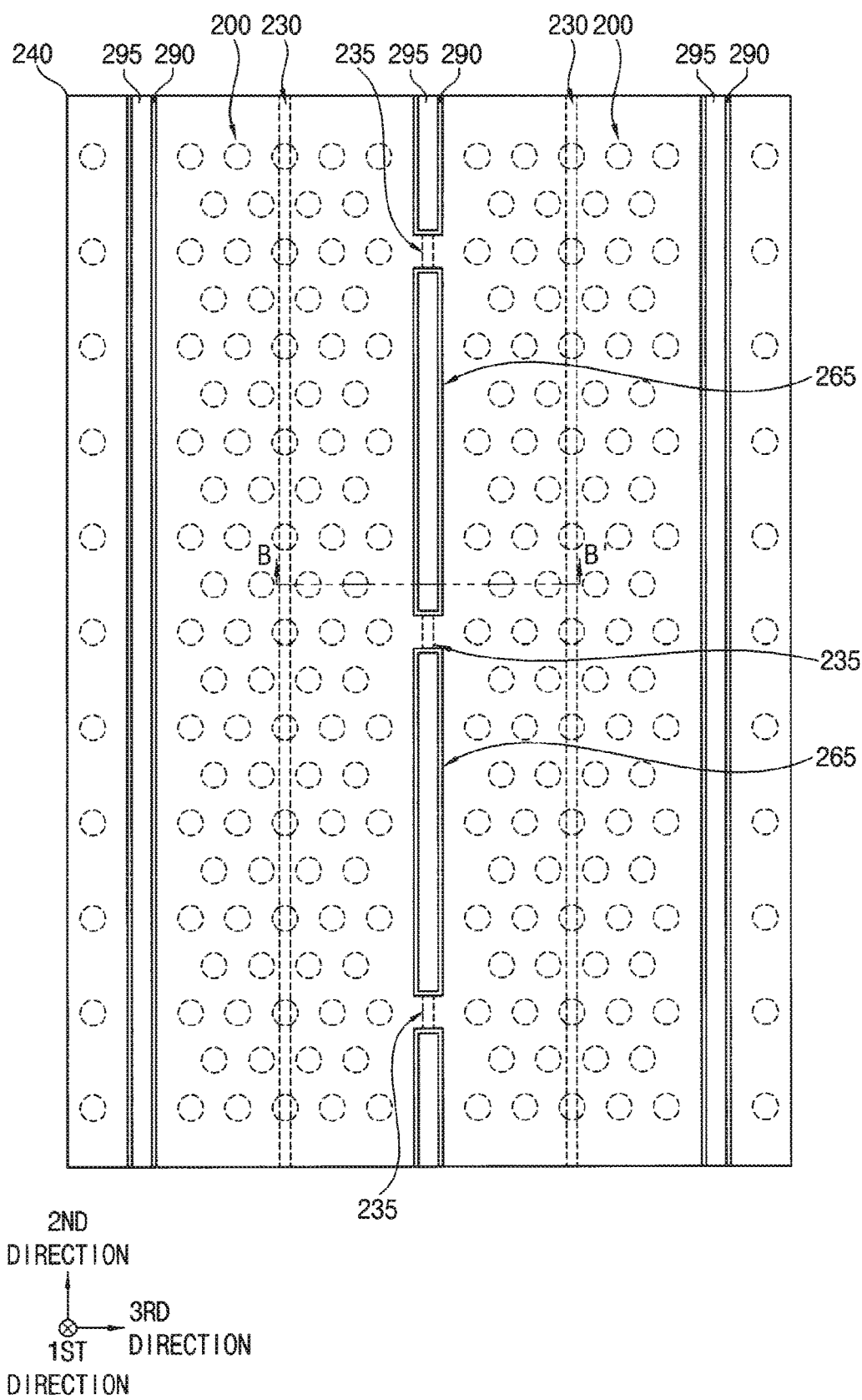
Figure 17:
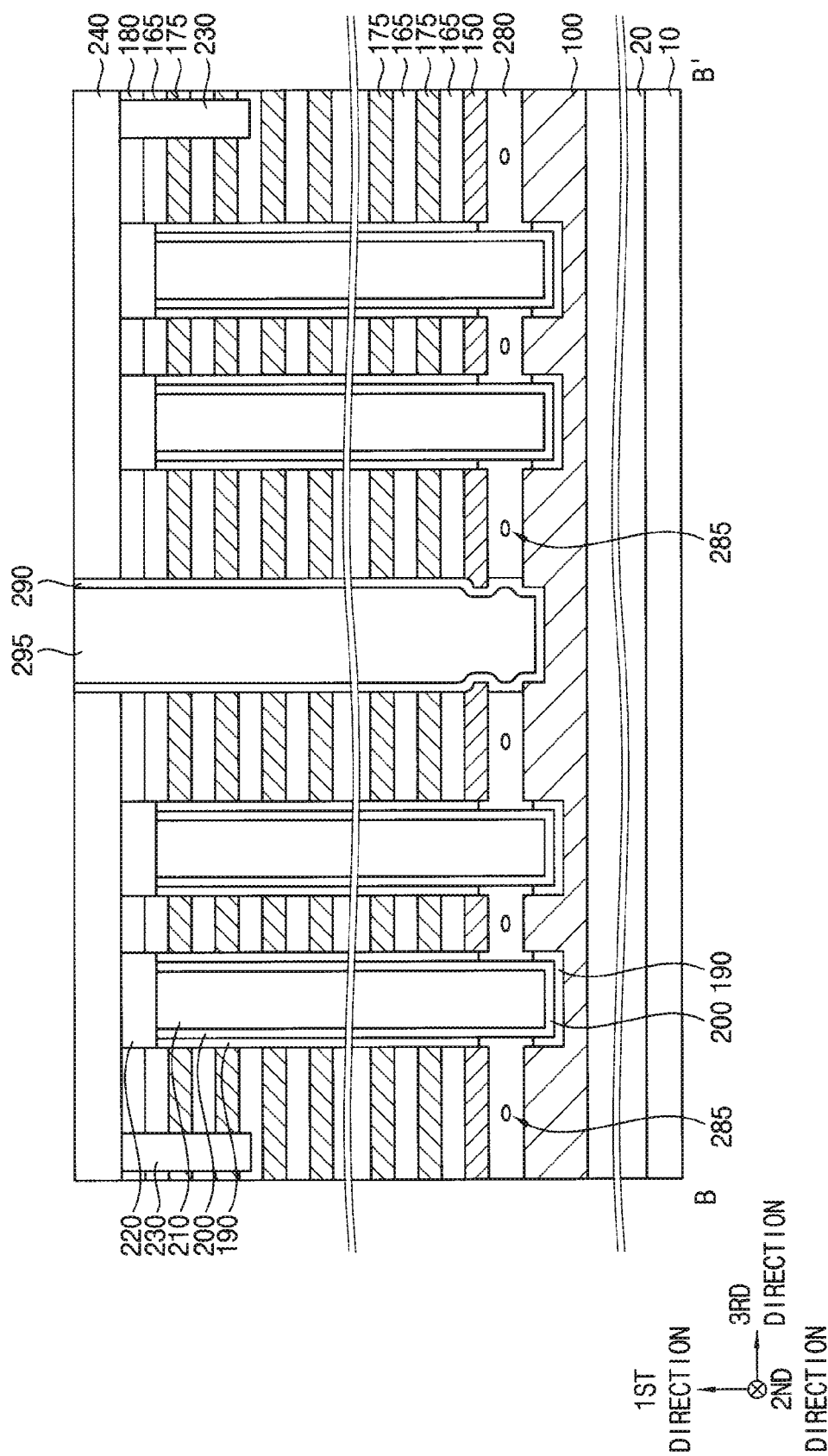

Referring to FIGS. 16 and 17, a second spacer 290 may be formed on the sidewalls of the third and fourth openings 260 and 265 and the exposed upper surface of the CSP 100, and a fifth sacrificial layer 295 may be formed on the second spacer 290 to fill the third and fourth openings 260 and 265.

If the channel connection pattern 280 does not remain in the second gap 275, the second spacer 290 may be also formed on lower and upper surfaces and sidewalls of the second gap 275, and a remaining portion of the second gap 275 may be filled with the fifth sacrificial layer 295.

The second spacer 290 may include a nitride, e.g., silicon nitride, and the fifth sacrificial layer 295 may include, e.g., polysilicon.

Figure 19:
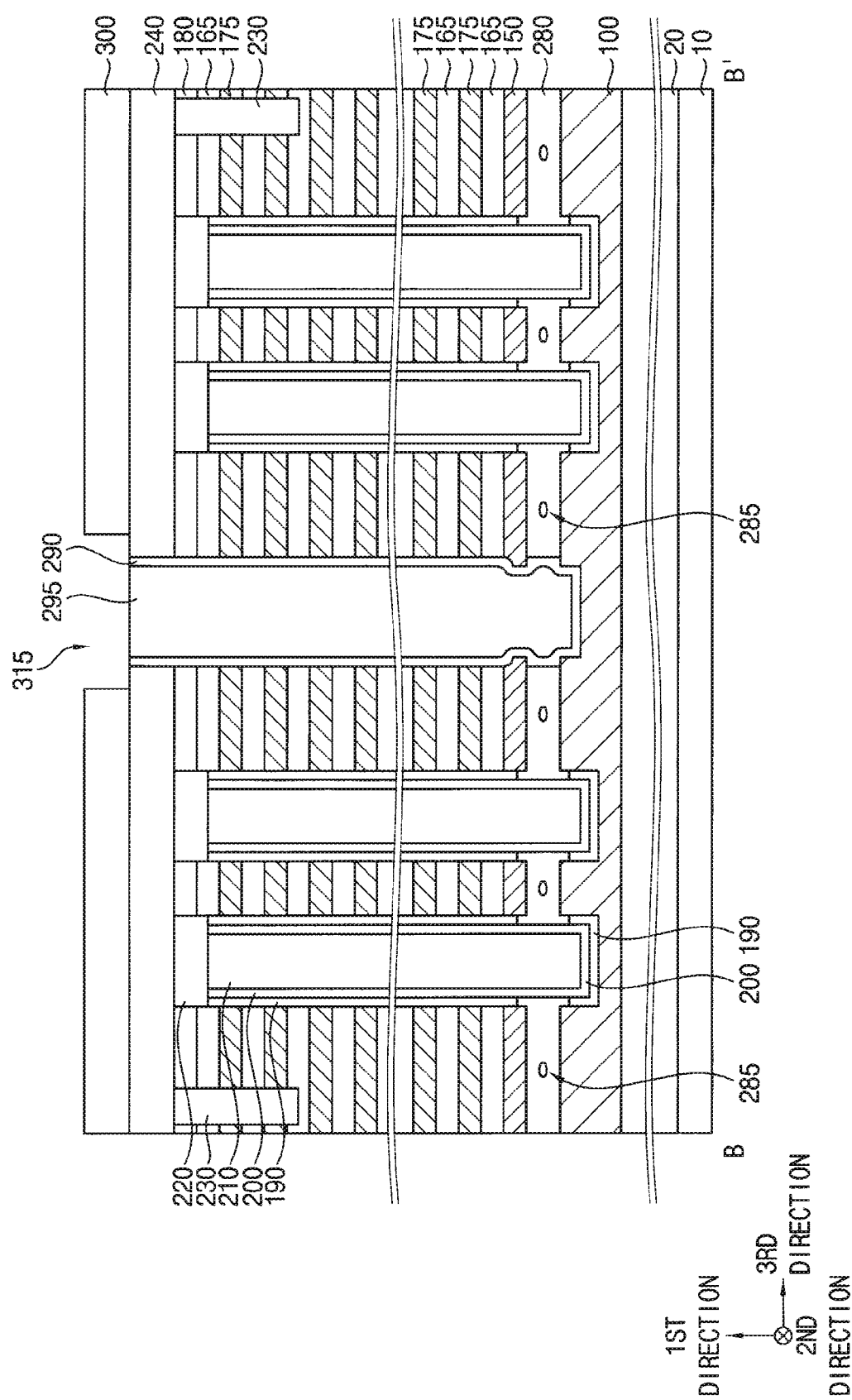

Referring to FIGS. 18 and 19, the second support layer 300 may be formed on the third insulating interlayer 240, the second spacer 290, and the fifth sacrificial layer 295, and may be partially etched to form the fifth and sixth openings 310 and 315.

In exemplary embodiments of the inventive concept, the fifth opening 310 may overlap in the first direction the third opening 260 in which the second spacer 290 and the fifth sacrificial layer 295 are formed, and a plurality of fifth openings 310 may be spaced apart from one another in the second direction on each of the third openings 260. In an exemplary embodiment of the inventive concept, the fifth opening 310 may have a width in the third direction greater than that of the third opening 260; however, the inventive concept may not be limited thereto.

In exemplary embodiments of the inventive concept, the sixth opening 315 may overlap in the first direction the second division pattern 235 and the fourth opening 265 in which the second spacer 290 and the fifth sacrificial layer 295 are formed, and a plurality of sixth openings 315 may be spaced apart from one another in the second direction on the second division pattern 235 and the fourth opening 265. In an exemplary embodiment of the inventive concept, the sixth opening 315 may have a width in the third direction greater than those of the fourth opening 265 and the second division pattern 235; however, the inventive concept may not be limited thereto.

In an exemplary embodiment of the inventive concept, the sixth opening 315 may overlap in the first direction opposite portions of the fourth openings 265 neighboring in the second direction and the second division pattern 235 therebetween.

In exemplary embodiments of the inventive concept, the fifth and sixth openings 310 and 315 may be arranged in a zigzag pattern in the second direction. The fifth and sixth openings 310 and 315 may partially overlap each other in the third direction.

Figure 20:
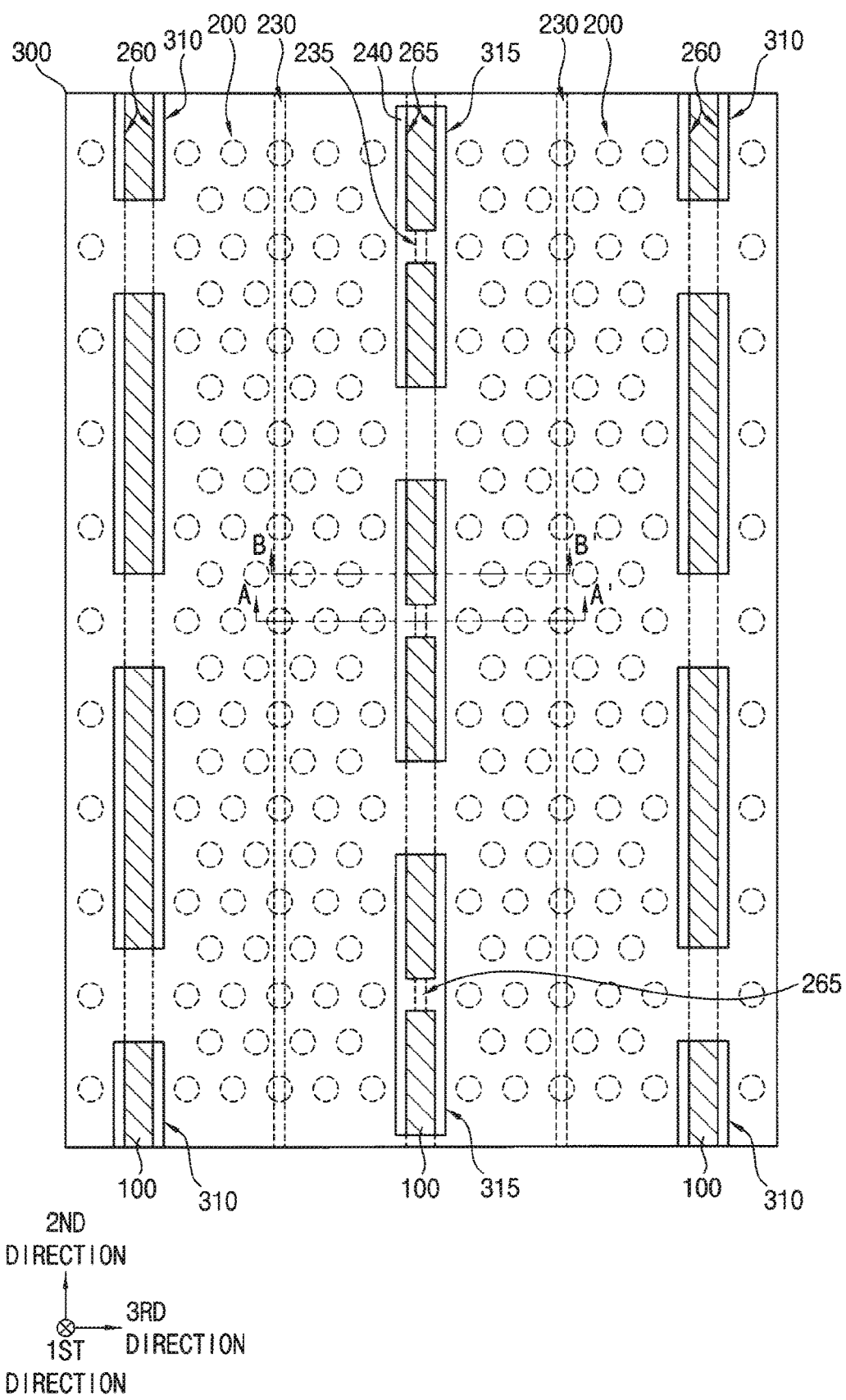
Figure 21:
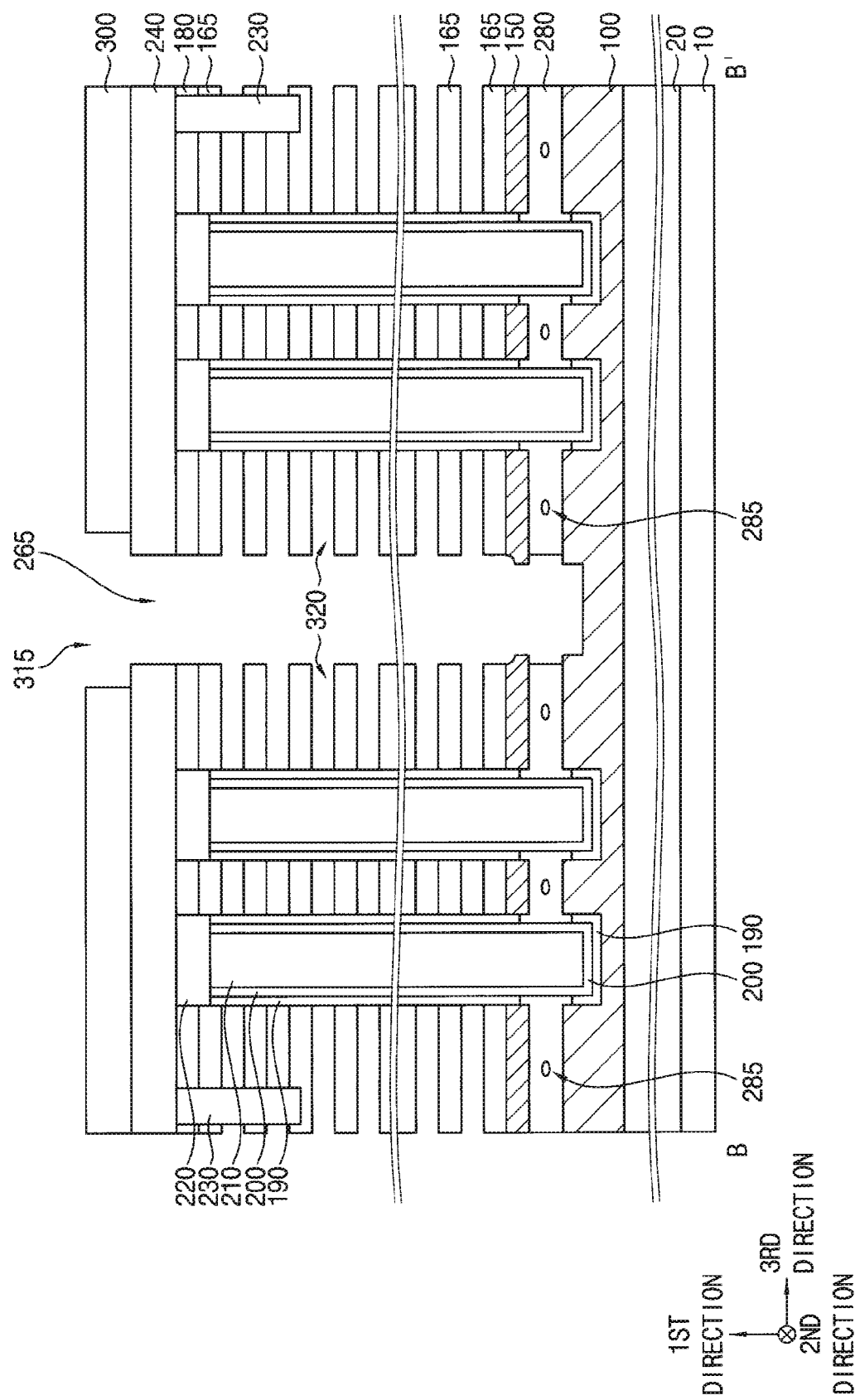

Referring to FIGS. 20 and 21, the second spacer 290 and the fifth sacrificial layer 295 in the third and fourth openings 260 and 265 may be removed through the fifth and sixth openings 310 and 315, and thus the third and fourth openings 260 and 265 may be formed again.

Even though the third and fourth openings 260 and 265 are formed again, upper ends of the third and fourth openings 260 and 265 may be at least partially covered by the second support layer 300. Thus, even though the mold has a high upper surface and a long extension length in the second direction, the mold may not be bent or fall down in the third direction due to the second support layer 300 at least partially covering an area of the third and fourth openings 260 and 265.

In exemplary embodiments of the inventive concept, the second spacer 290 and the fifth sacrificial layer 295 may be removed by a wet etching process, and if the second spacer 290 and the fifth sacrificial layer 295 are formed in the second gap 275, they may be also removed to form the second gap 275 again.

The fourth sacrificial patterns 175 exposed by the third and fourth openings 260 and 265 may be removed to form a third gap 320 between the insulation patterns 165 at respective levels, and a portion of an outer sidewall of the charge storage structure 190 may be exposed by the third gaps 320.

In exemplary embodiments of the inventive concept, the fourth sacrificial patterns 175 may be removed by a wet etching process using phosphoric acid or sulfuric acid.

Figure 22:
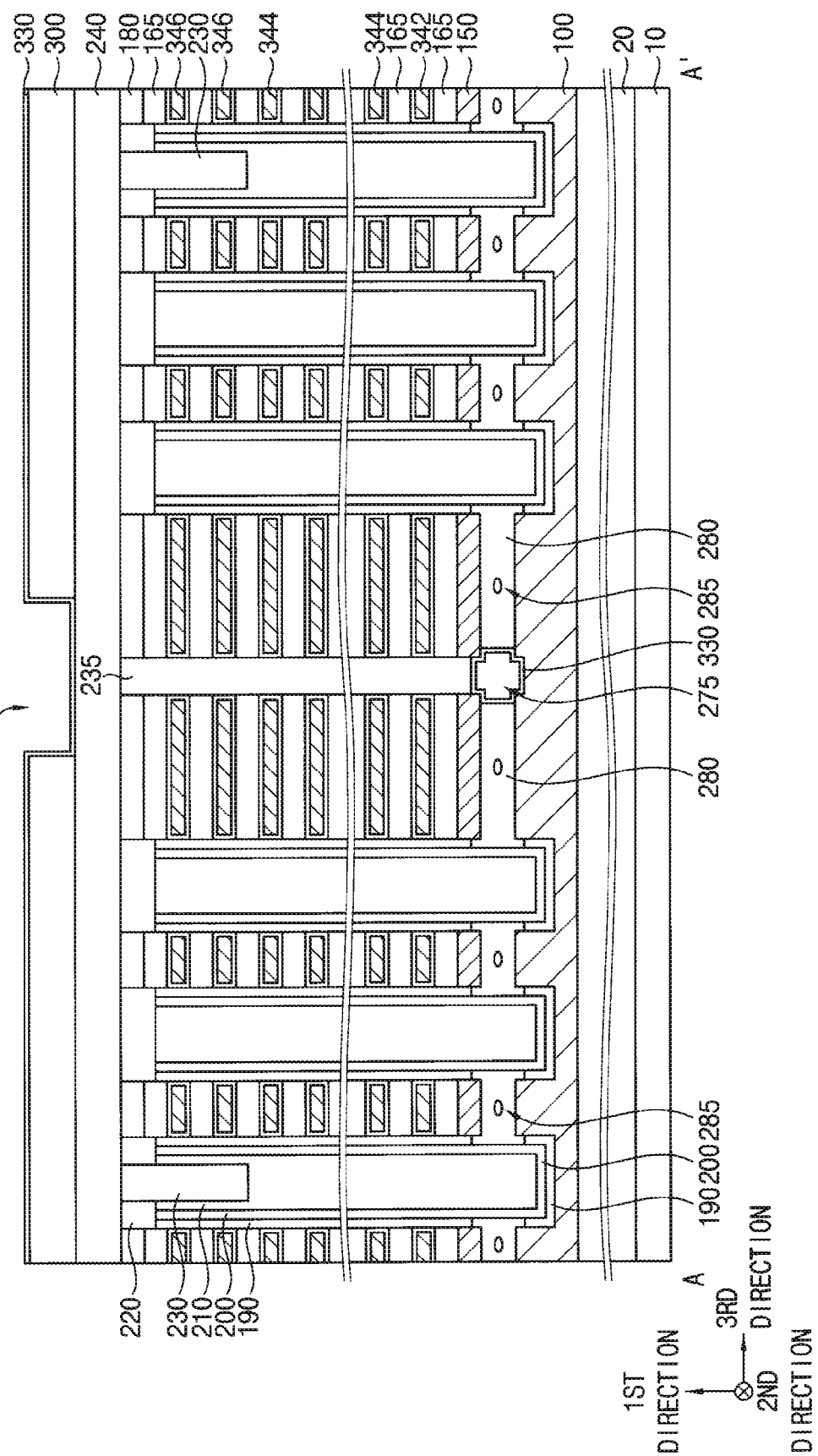
Figure 23:
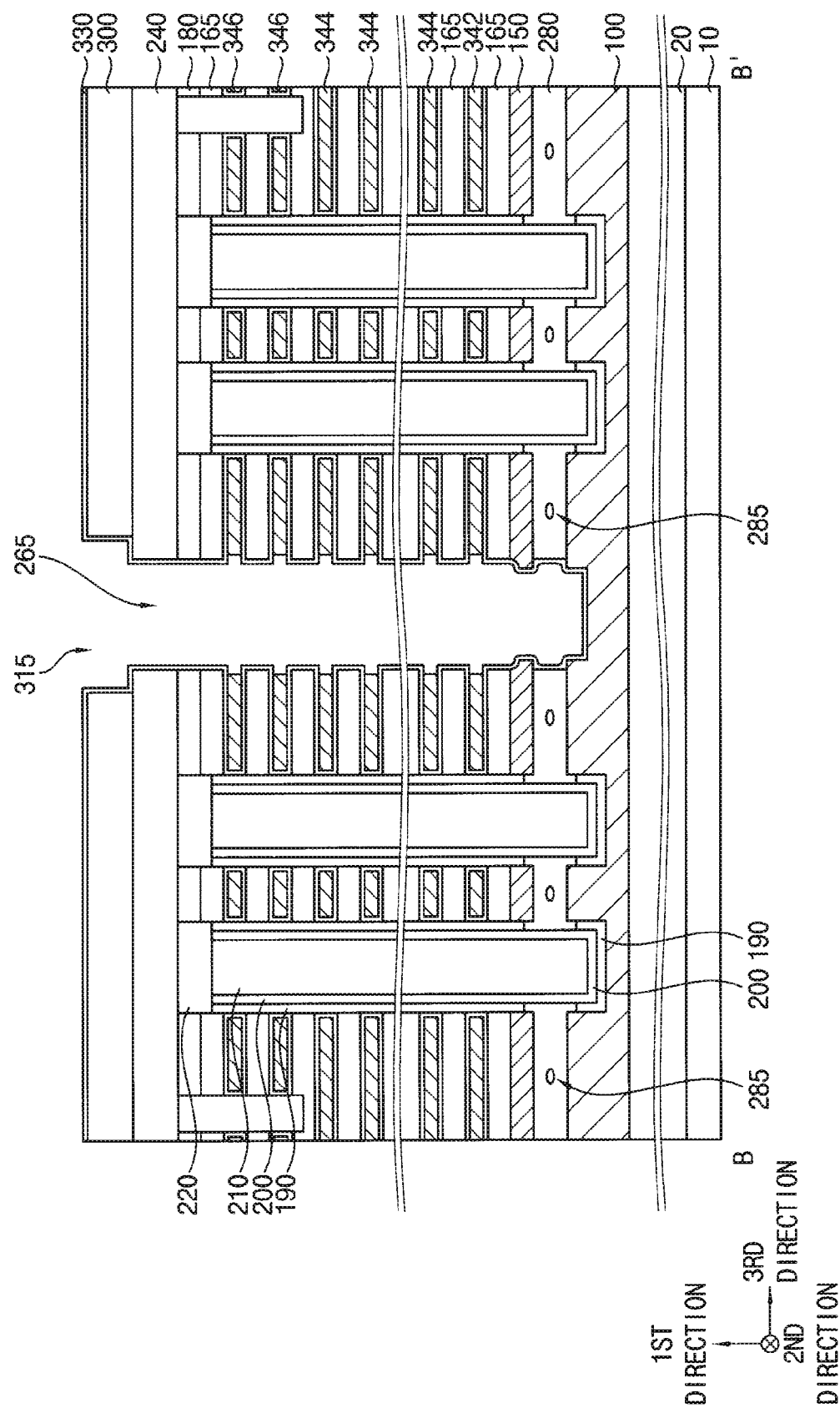

Referring to FIGS. 22 and 23, a second blocking layer 330 may be formed on the exposed portion of the outer sidewall of the charge storage structure 190, inner wall of the third gaps 320, surfaces of the insulation patterns 165, a sidewall of the first support layer 150, a sidewall of the channel connection pattern 280, an upper surface of the CSP 100, a sidewall and a portion of an upper surface of the third insulating interlayer 240, and a sidewall and an upper surface of the second support layer 300. A gate electrode layer may be formed on the second blocking layer 330.

If the second gap 275 is formed again, the second blocking layer 330 and the gate electrode layer may be formed in the second gap 275.

The gate electrode layer may include a gate barrier layer and a gate conductive layer sequentially stacked. The gate barrier layer may include a metal nitride, and the gate conductive layer may include a metal.

The gate electrode layer may be partially removed to form a gate electrode in each of the third gaps 320. In exemplary embodiments of the inventive concept, the gate electrode layer may be partially removed by a wet etching process. If the second blocking layer 330 and the gate electrode layer are formed in the second gap 275, the gate electrode layer may be removed.

In exemplary embodiments of the inventive concept, the gate electrode may extend in the second direction, and a plurality of gate electrodes may be formed in the first direction to form a gate electrode structure. The gate electrode structure may have a staircase shape including step layers of the gate electrodes.

Additionally, a plurality of gate electrode structures may be formed in the third direction, and may be spaced apart from one another by the third and fourth openings 260 and 265 and the second division pattern 235. The gate electrode structure may include the first, second, and third gate electrodes 342, 344, and 346 sequentially stacked in the first direction. In exemplary embodiments of the inventive concept, the first gate electrode 342 may be formed at a lowermost level, and may serve as a ground selection line (GSL). The third gate electrode 346 may be formed at an uppermost level and a second level from above (e.g., below the uppermost level), and may serve as a string selection line (SSL). The second gate electrode 344 may be formed at a plurality of levels between the first and third gate electrodes 342 and 346, and may serve as a word line.

Figure 24:
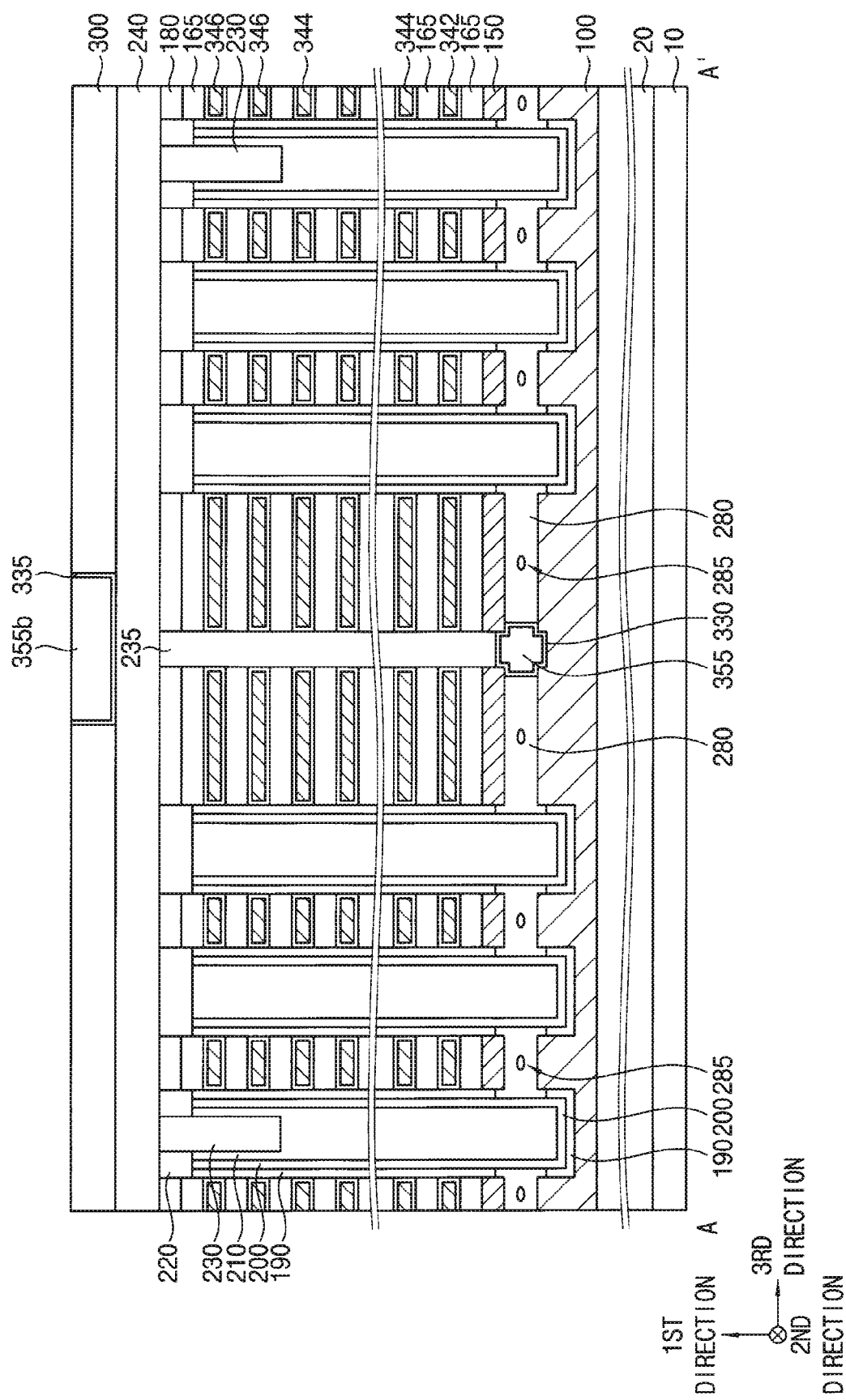
Figure 25:
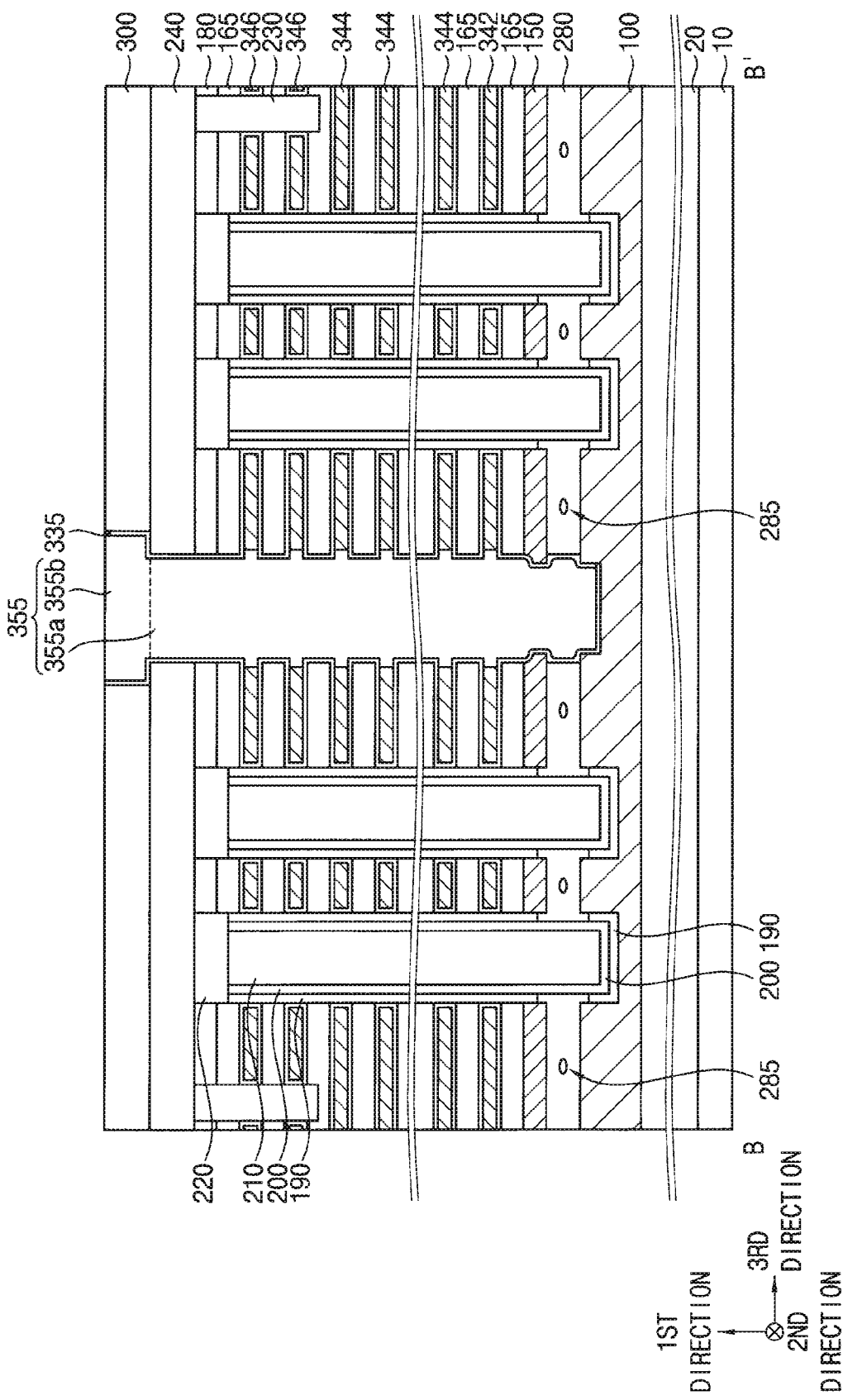

Referring to FIGS. 1, 24, and 25, a third division layer may be formed on the second blocking layer 330 to fill the third to sixth openings 260, 265, 310, and 315, and the third division layer and the second blocking layer 330 may be planarized until an upper surface of the second support layer 300 may be exposed to form the third and fourth division patterns 350 and 355 and the second blocking pattern 335.

The third division pattern 350 may fill the third and fifth openings 260 and 310, and may extend in the second direction. The first upper portion 350b filling the fifth opening 310 may have a width in the third direction greater than that of the first lower portion 350a filling the third opening 260, and a plurality of first upper portions 350b may be spaced apart from one another in the second direction on the first lower portion 350a extending in the second direction.

The fourth division pattern 355 may fill the fourth and sixth openings 265 and 315. The second upper portion 355b filling the sixth opening 315 may have a width in the third direction greater than that of the second lower portion 355a filling the fourth opening 265. The second lower portion 355a may extend in the second direction, but may be partially cut by the second division patterns 235. The second upper portions 355b may be spaced apart from one another in the second direction on the second lower portions 355a and the second division patterns 235.

If the second blocking layer 330 is formed in the second gap 275 and the gate electrode layer is removed from the second gap 275, the protrusion portion 355c of the fourth division pattern 355 may be formed in a remaining portion of the second gap 275.

Referring back to FIGS. 2A, 2B, and 3, the fourth insulating interlayer 360 may be formed on the second support layer 300, the third and fourth division patterns 350 and 355, and the second blocking pattern 335, and the contact plug 370 may be formed through the third and fourth insulating interlayers 240 and 360 and the second support layer 300 to contact an upper surface of the capping pattern 220.

A fifth insulating interlayer may be formed on the fourth insulating interlayer 360 and the contact plug 370, and the upper wiring 380 may be formed through the fifth insulating interlayer to contact an upper surface of the contact plug 370. The upper wiring 380 may serve as a bit line of the vertical memory device. In exemplary embodiments of the inventive concept, the upper wiring 380 may extend in the third direction, and a plurality of upper wirings 380 may be spaced apart from one another in the second direction.

The vertical memory device may be manufactured by the above-described processes.

As illustrated above, even though the mold has a high upper surface and a long extension length in the second direction, due to the second support layer 300 at least partially covering an upper end of the third opening 260 extending through the mold and extending in the second direction, and the second division pattern 235 between the fourth openings 265 each extending through the mold spaced apart from one another in the second direction, the mold may not be bent or fall down in the third direction.

Figure 26:
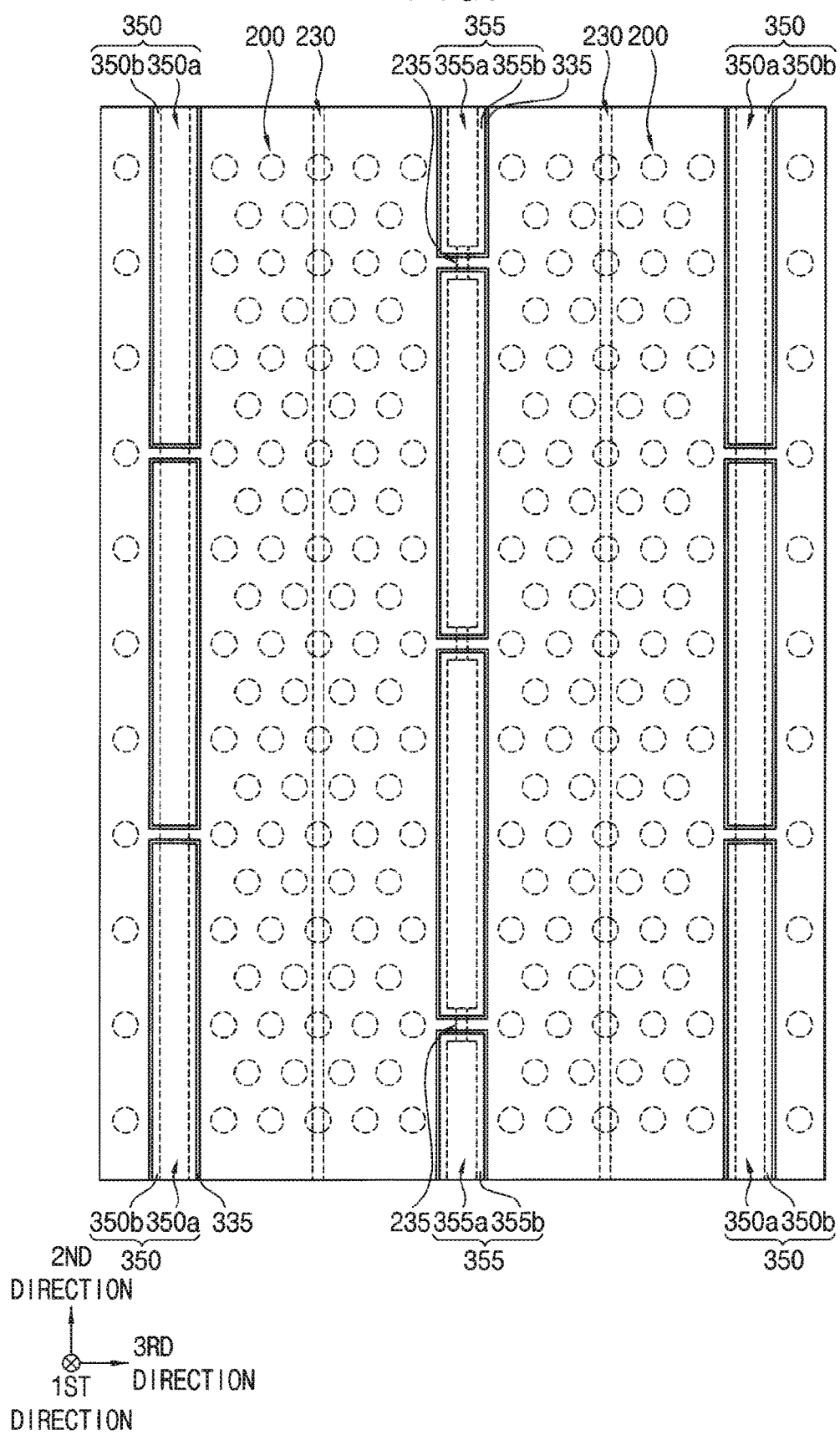
FIGS. 26 and 27 are plan views illustrating vertical memory devices in accordance with exemplary embodiments of the inventive concept.
Figure 27:
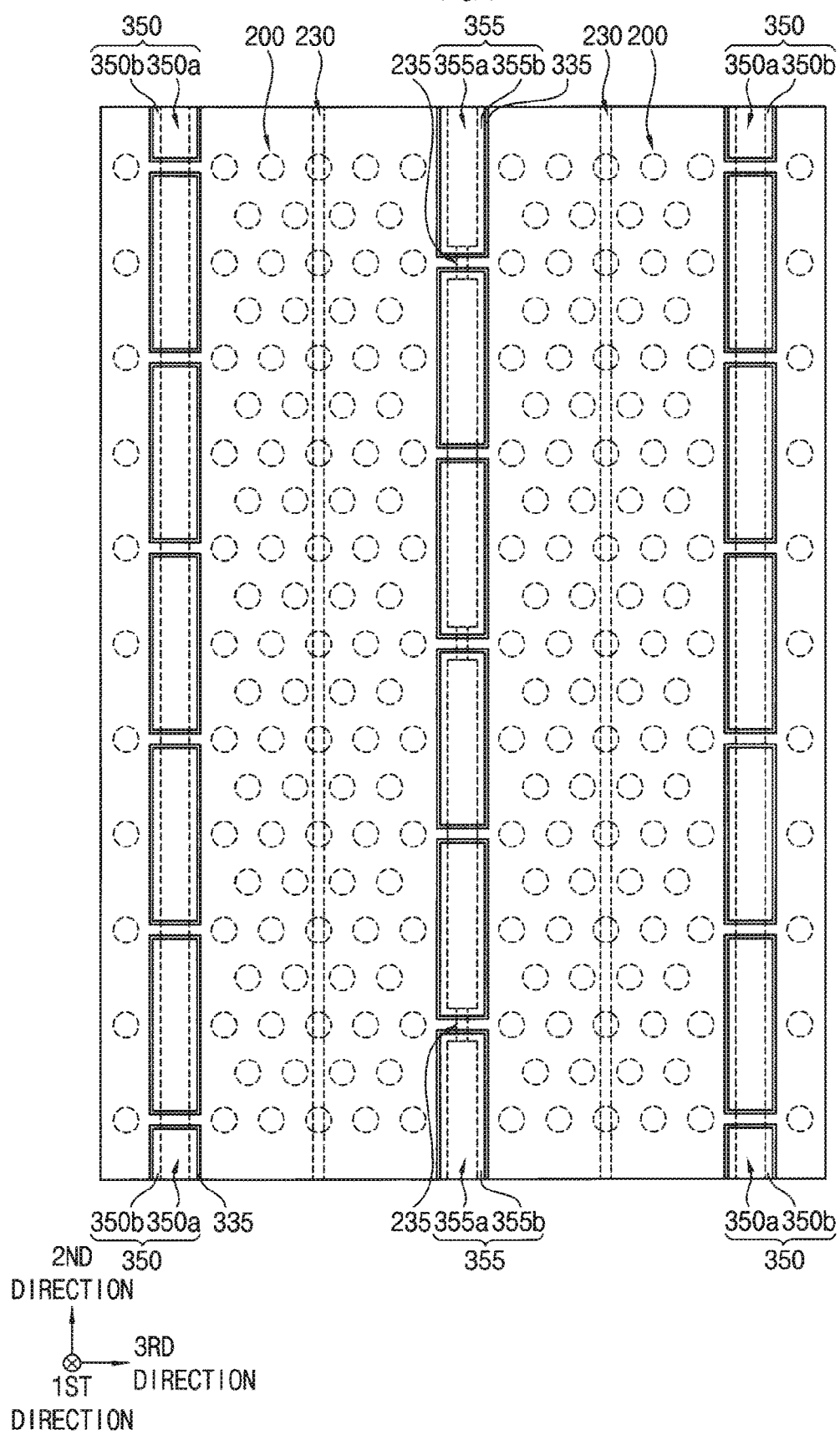

FIGS. 26 and 27 are plan views illustrating vertical memory devices in accordance with exemplary embodiments of the inventive concept. The vertical memory devices may be substantially the same as that of FIGS. 1 to 3, except for some elements. Thus, like reference numerals refer to like elements, and detailed descriptions thereof are omitted herein.

Referring to FIG. 26, the fourth division pattern 355 may include the second lower portions 355a spaced apart from one another in the second direction and connected to the second division patterns 235, and the second upper portions 355b contacting upper surfaces of the second lower portions 355a, respectively.

In this case, the first and second upper portions 350b and 355b of the third and fourth division patterns 350 and 355, respectively, may be arranged in a zigzag pattern in the second direction or in the third direction, and the first upper portions 350b of each of the third division patterns 350 may overlap in the third direction the second upper portions 355b of the fourth division patterns 355.

Referring to FIG. 27, the fourth division pattern 355 may include the second lower portions 355a spaced apart from one another in the second direction and connected to the second division patterns 235, and the second upper portions 355b spaced apart from one another in the second direction and contacting upper surfaces of the second lower portions 355a, respectively.

In this case, the first and second upper portions 350b and 355b of the third and fourth division patterns 350 and 355, respectively, may be arranged in a zigzag pattern in the second direction or in the third direction, and the first upper portions 350b of each of the third division patterns 350 may overlap in the third direction the second upper portions 355b of the fourth division patterns 355.

Figure 28:
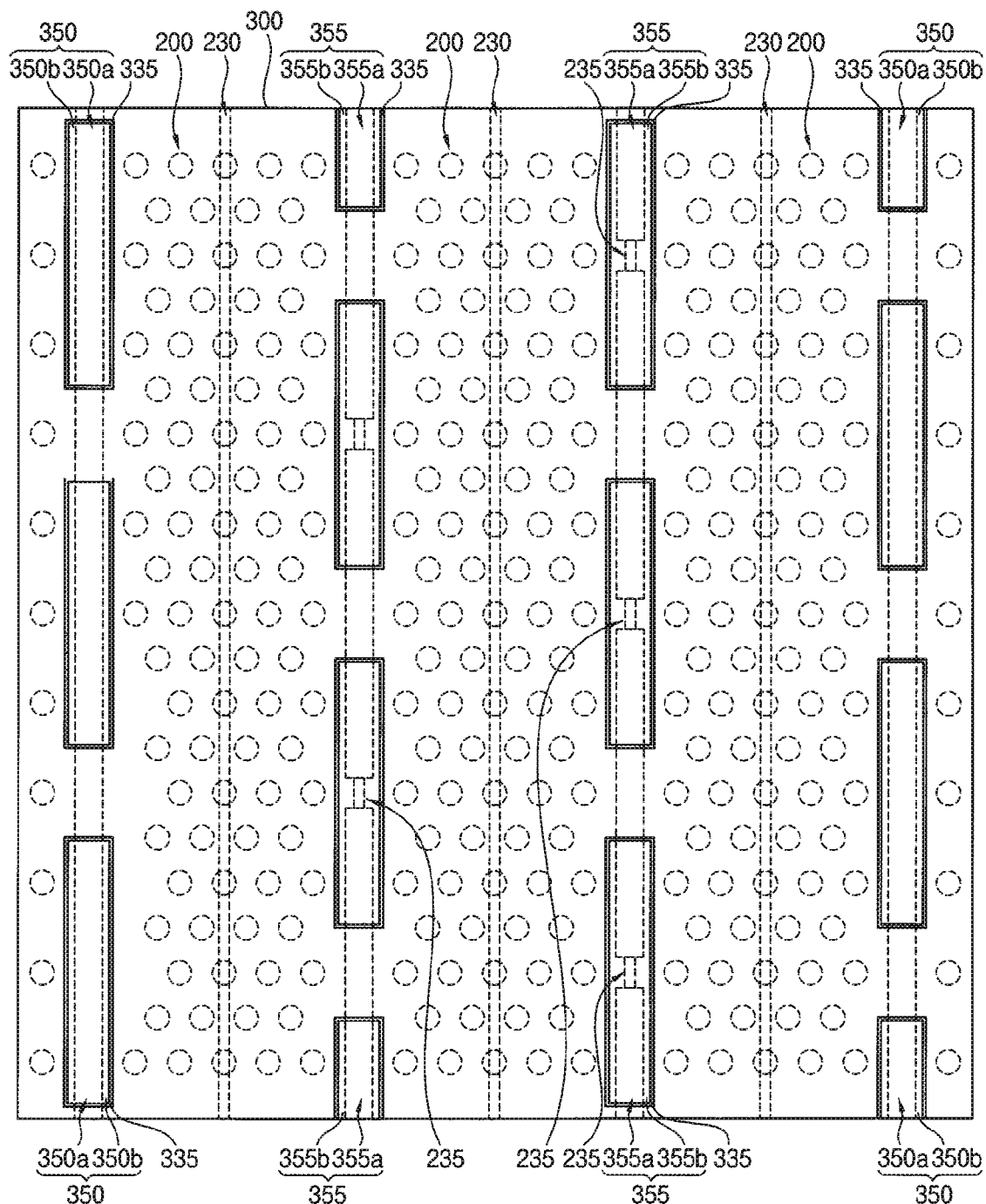
FIGS. 28 to 30 are plan views illustrating vertical memory devices in accordance with exemplary embodiments of the inventive concept.
Figure 29:
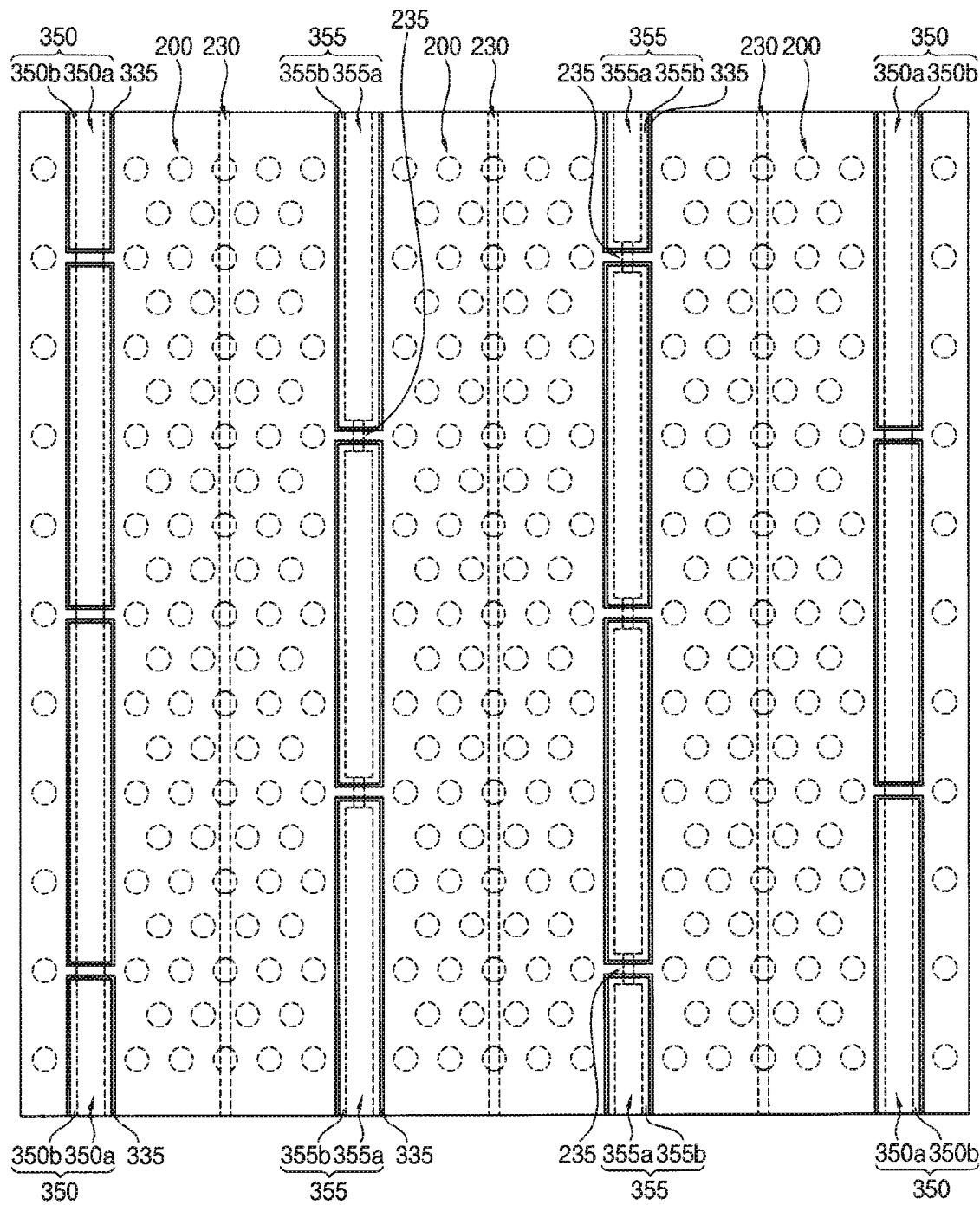
Figure 30:
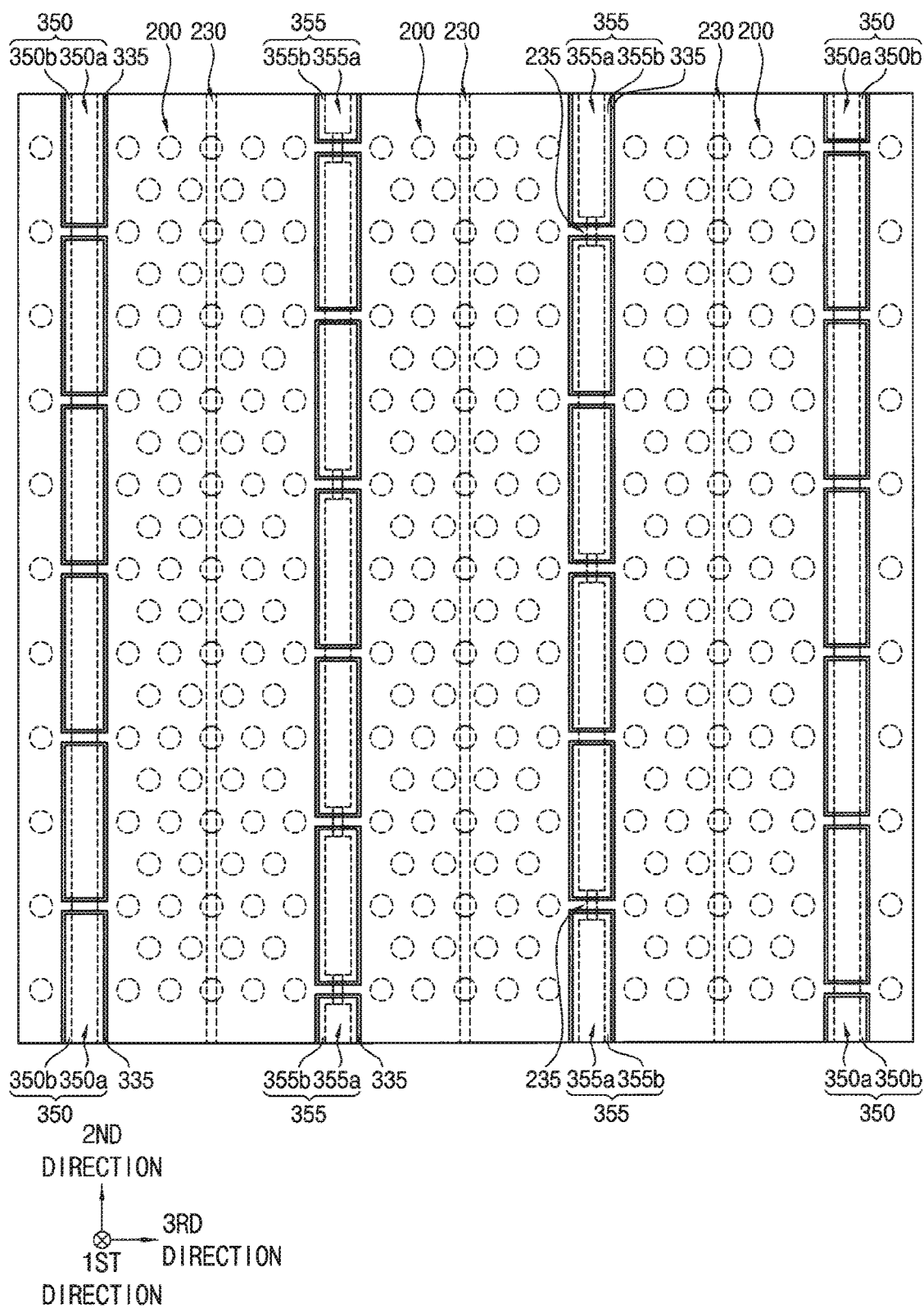

FIGS. 28 to 30 are plan views illustrating vertical memory devices in accordance with exemplary embodiments of the inventive concept. The vertical memory devices may be substantially the same as that of FIGS. 1, 26, and 27, except for some elements. Thus, like reference numerals refer to like elements, and detailed descriptions thereof are omitted herein.

Referring to FIGS. 28 to 30, a plurality of fourth division patterns 355 may be spaced apart from one another in the third direction between the third division patterns 350 neighboring in the third direction.

In other words, the fourth division patterns 355 spaced apart from one another in the second direction may form a fourth division pattern column, and a plurality of fourth division pattern columns may be spaced apart from one another in the third direction between the third division patterns 350 neighboring in the third direction.

As described above, the vertical memory device in accordance with exemplary embodiments of the inventive concept may include second to fourth division patterns between gate electrode structures, and a second support layer on the gate electrode structures. Thus, the gate electrode structures may not be bent or fall down.

While the inventive concept has been particularly shown and described with reference to exemplary embodiments thereof, it will be understood by one of ordinary skill in the art that variations in form and detail may be made thereto without departing from the spirit and scope of the inventive concept as set forth by the appended claims.

What is claimed is:

1. A vertical memory device comprising:
gate electrode structures each including gate electrodes spaced apart from one another on a substrate in a first direction substantially perpendicular to an upper surface of the substrate, wherein each of the gate electrodes extends in a second direction substantially parallel to the upper surface of the substrate, and the gate electrode structures are spaced apart from one another in a third direction substantially parallel to the upper surface of the substrate and crossing the second direction;
channels each extending through one of the gate electrode structures in the first direction;

first division patterns each extending in the second direction between first ones of the gate electrode structures neighboring in the third direction to separate the first ones of the gate electrode structures from one another, wherein upper portions of the first division patterns are spaced apart from each other;

second division patterns spaced apart from one another in the second direction between second ones of the gate electrode structures neighboring in the third direction;

a support layer on the gate electrode structures and the first division patterns and the second division patterns, and including first openings and second openings at least partially exposing upper surfaces of the upper portions of the first division patterns and upper surfaces of the second division patterns, respectively; and first insulation patterns and second insulation patterns filling the first openings and the second openings, respectively, wherein the first insulation patterns and the second insulation patterns are arranged in a zigzag pattern in the third direction.

2. The vertical memory device of claim 1, wherein each of the first insulation patterns partially overlaps at least one of the second insulation patterns in the third direction.

3. The vertical memory device of claim 1, wherein the first insulation patterns and the second insulation patterns are arranged in a zigzag pattern in the second direction.

4. The vertical memory device of claim 1, wherein portions of the second division patterns spaced apart from one another in the second direction form a plurality of second division pattern columns, and wherein the plurality of second division pattern columns are spaced apart from one another in the third direction between neighboring first division patterns of the first division patterns neighboring in the third direction.

5. The vertical memory device of claim 1, further comprising third division patterns between neighboring second division patterns of the second division patterns spaced apart from one another in the second direction and connected to the neighboring second division patterns, wherein the second and third division patterns separate the second ones of the gate electrode structures neighboring in the third direction.

6. The vertical memory device of claim 1, wherein the first insulation pattern is one of a plurality of first insulation patterns spaced apart from one another in the second direction on each of the first division patterns, and wherein the second insulation pattern commonly contacts upper surfaces of neighboring second division patterns of the second division patterns neighboring in the second direction.

7. The vertical memory device of claim 1, wherein the first insulation pattern is one of a plurality of first insulation patterns spaced apart from one another in the second direction on each of the first division patterns, and wherein the second insulation pattern contacts the upper surface of each of the second division patterns.

8. The vertical memory device of claim 1, wherein a width in the third direction of each of the first insulation patterns is greater than a width in the third direction of each of the first division patterns.

9. The vertical memory device of claim 1, wherein a width in the third direction of each of the second insulation patterns is greater than a width in the third direction of each of the second division patterns.

10. A vertical memory device comprising:

a common source plate (CSP) on a substrate;

a channel connection pattern and a first support layer sequentially stacked on the CSP in a first direction substantially perpendicular to an upper surface of the substrate;

gate electrode structures each including gate electrodes spaced apart from one another on the first support layer in the first direction, wherein each of the gate electrodes extends in a second direction substantially parallel to the upper surface of the substrate, and the gate electrode structures are spaced apart from one another in a third direction substantially parallel to the upper surface of the substrate and crossing the second direction;

channels each extending in the first direction through one of the gate electrode structures, the first support layer, and the channel connection pattern on the CSP, wherein the channels are electrically connected to one another;

a first division pattern extending in the second direction between first ones of the gate electrode structures neighboring in the third direction to separate the first ones of the gate electrode structures from one another;

second and third division patterns alternately disposed in the second direction between second ones of the gate electrode structures neighboring in the third direction to separate the second ones of the gate electrode structures from one another; and a second support layer on the gate electrode structures, wherein the second support layer is at substantially the same height as upper portions of the first and second division patterns, wherein the upper portions of the first division pattern and the upper portions of the second division patterns are arranged in a zigzag pattern in the second direction.

11. The vertical memory device of claim 10, further comprising a charge storage structure covering an outer sidewall of each of the channels.

12. The vertical memory device of claim 10, wherein each of the upper portions of the first division patterns partially overlaps the upper portions of the second division patterns in the third direction.

13. The vertical memory device of claim 10, wherein the first division pattern is one of a plurality of first division patterns spaced apart from one another in the third direction, and wherein the second division pattern is disposed between neighboring first division patterns of the plurality of first division patterns neighboring in the third direction.

14. The vertical memory device of claim 13, wherein the second division pattern is one of a plurality of second division patterns spaced apart from one another in the third direction between the neighboring first division patterns.

15. The vertical memory device of claim 10, wherein the first division pattern includes a lower portion extending in the second direction, and wherein the upper portions of the first division pattern are spaced apart from one another in the second direction, and each of the upper portions of the first division pattern contact an upper surface of the lower portion of the first division pattern.

16. The vertical memory device of claim 15, wherein a distance of the upper surface of the lower portion of the first division pattern from the substrate is greater than a distance of an upper surface of the third division pattern from the substrate.

17. The vertical memory device of claim 10, wherein the second division pattern includes lower portions spaced apart from one another in the second direction and connected to the third division patterns, and wherein the upper portion of the second division pattern commonly contacts upper surfaces of neighboring lower portions of the lower portions neighboring in the second direction.

18. The vertical memory device of claim 17, wherein the third division pattern overlaps the upper portion of the second division pattern in the first direction.

19. The vertical memory device of claim 10, wherein the second division pattern includes lower portions spaced apart from one another in the second direction and connected to the third division patterns, and wherein the upper portions of the second division pattern contact upper surfaces of the lower portions, respectively.

20. The vertical memory device of claim 10, wherein the second division pattern includes lower portions spaced apart from one another in the second direction and connected to the third division patterns, and wherein the upper portions of the second division pattern are spaced apart from one another on each of the lower portions, and each contact an upper surface of a corresponding one of the lower portions.

\* \* \* \* \*